United States Patent
Takada

(10) Patent No.: US 8,981,476 B2
(45) Date of Patent: Mar. 17, 2015

(54) SEMICONDUCTOR DEVICE WITH HIGH BREAKDOWN VOLTAGE AND MANUFACTURE THEREOF

(71) Applicant: Fujitsu Semiconductor Limited, Yokohama-shi, Kanagawa (JP)

(72) Inventor: Kazuhiko Takada, Mitaka (JP)

(73) Assignee: Fujitsu Semiconductor Limited, Yokohama (JP)

( * ) Notice: Subject to any disclaimer, the term of this patent is extended or adjusted under 35 U.S.C. 154(b) by 87 days.

(21) Appl. No.: 13/710,837

(22) Filed: Dec. 11, 2012

(65) Prior Publication Data

US 2013/0168768 A1 Jul. 4, 2013

(30) Foreign Application Priority Data

Dec. 28, 2011 (JP) ................................ 2011-288084

(51) Int. Cl.
| | | |
|---|---|---|
| *H01L 29/66* | (2006.01) | |
| *H01L 27/06* | (2006.01) | |
| *H01L 29/78* | (2006.01) | |
| *H01L 29/08* | (2006.01) | |
| H01L 29/423 | (2006.01) | |
| H01L 29/45 | (2006.01) | |
| H01L 29/866 | (2006.01) | |
| H01L 29/06 | (2006.01) | |

(52) U.S. Cl.
CPC ...... *H01L 27/0629* (2013.01); *H01L 29/66484* (2013.01); *H01L 29/66689* (2013.01); *H01L 29/7816* (2013.01); *H01L 29/0873* (2013.01); H01L 29/42368 (2013.01); H01L 29/456 (2013.01); H01L 29/66106 (2013.01); H01L 29/66659 (2013.01); H01L 29/7835 (2013.01); H01L 29/866 (2013.01); H01L 29/0653 (2013.01); H01L 29/0692 (2013.01); H01L 29/0696 (2013.01)

USPC .......... 257/336; 257/335; 257/337; 257/338; 257/106; 257/175; 257/199; 257/328; 257/481; 257/551; 257/603; 257/E29.027; 257/E29.066

(58) Field of Classification Search
None
See application file for complete search history.

(56) References Cited

U.S. PATENT DOCUMENTS 6,580,126 B1 * 6/2003 Suzumura et al. ............ 257/343
6,835,627 B1 * 12/2004 Whiston et al. ............... 438/302

FOREIGN PATENT DOCUMENTS

JP 2009-239096 A 10/2009

* cited by examiner

*Primary Examiner* — David Vu
*Assistant Examiner* — Cuong B Nguyen
(74) *Attorney, Agent, or Firm* — Westerman, Hattori, Daniels & Adrian, LLP

(57) ABSTRACT

A semiconductor device includes: first and second n-type wells formed in p-type semiconductor substrate, the second n-type well being deeper than the first n-type well; first and second p-type backgate regions formed in the first and second n-type wells; first and second n-type source regions formed in the first and second p-type backgate regions; first and second n-type drain regions formed in the first and second n-type wells, at positions opposed to the first and second n-type source regions, sandwiching the first and the second p-type backgate regions; and field insulation films formed on the substrate, at positions between the first and second p-type backgate regions and the first and second n-type drain regions; whereby first transistor is formed in the first n-type well, and second transistor is formed in the second n-type well with a higher reverse voltage durability than the first transistor.

5 Claims, 23 Drawing Sheets

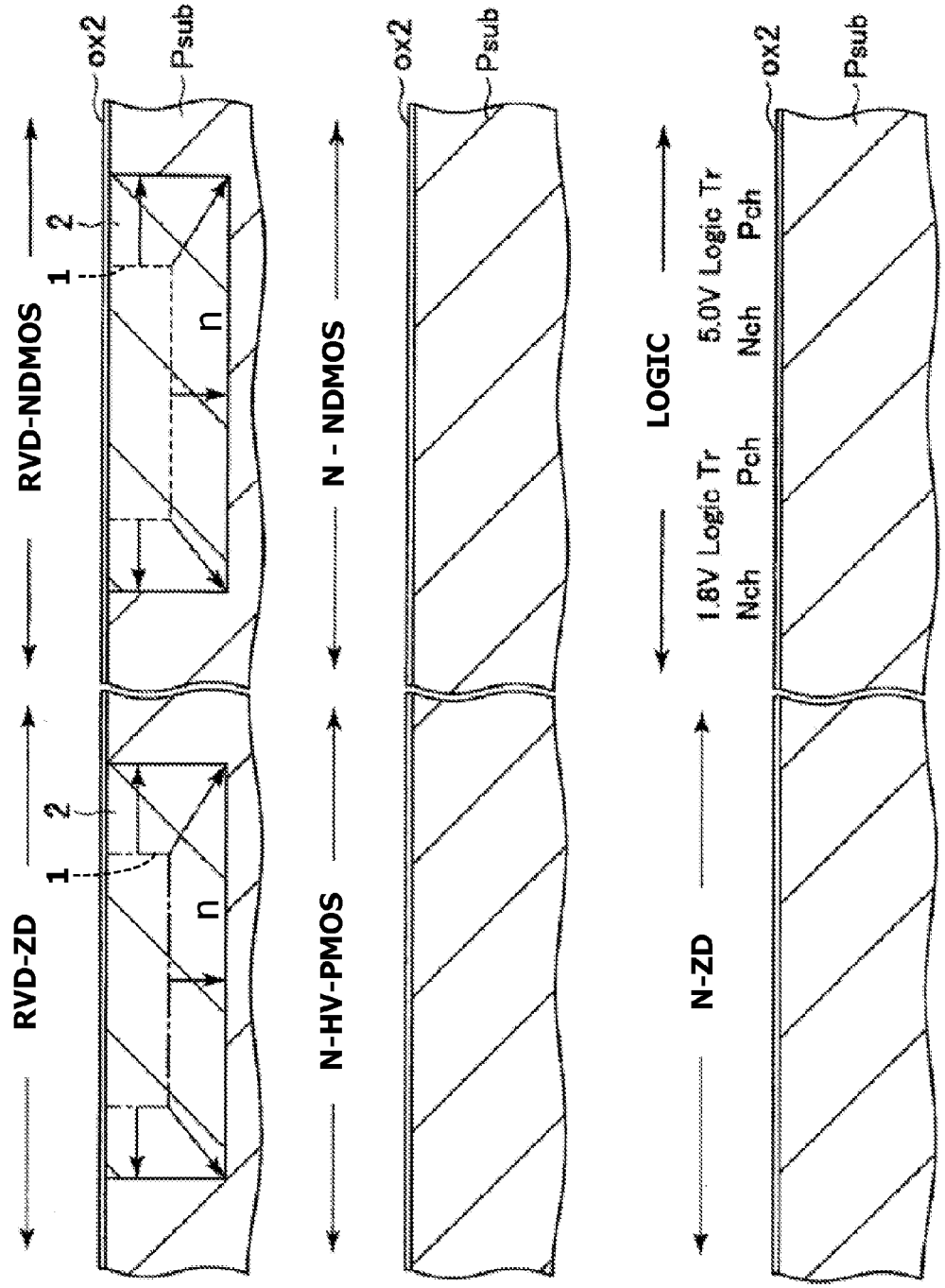

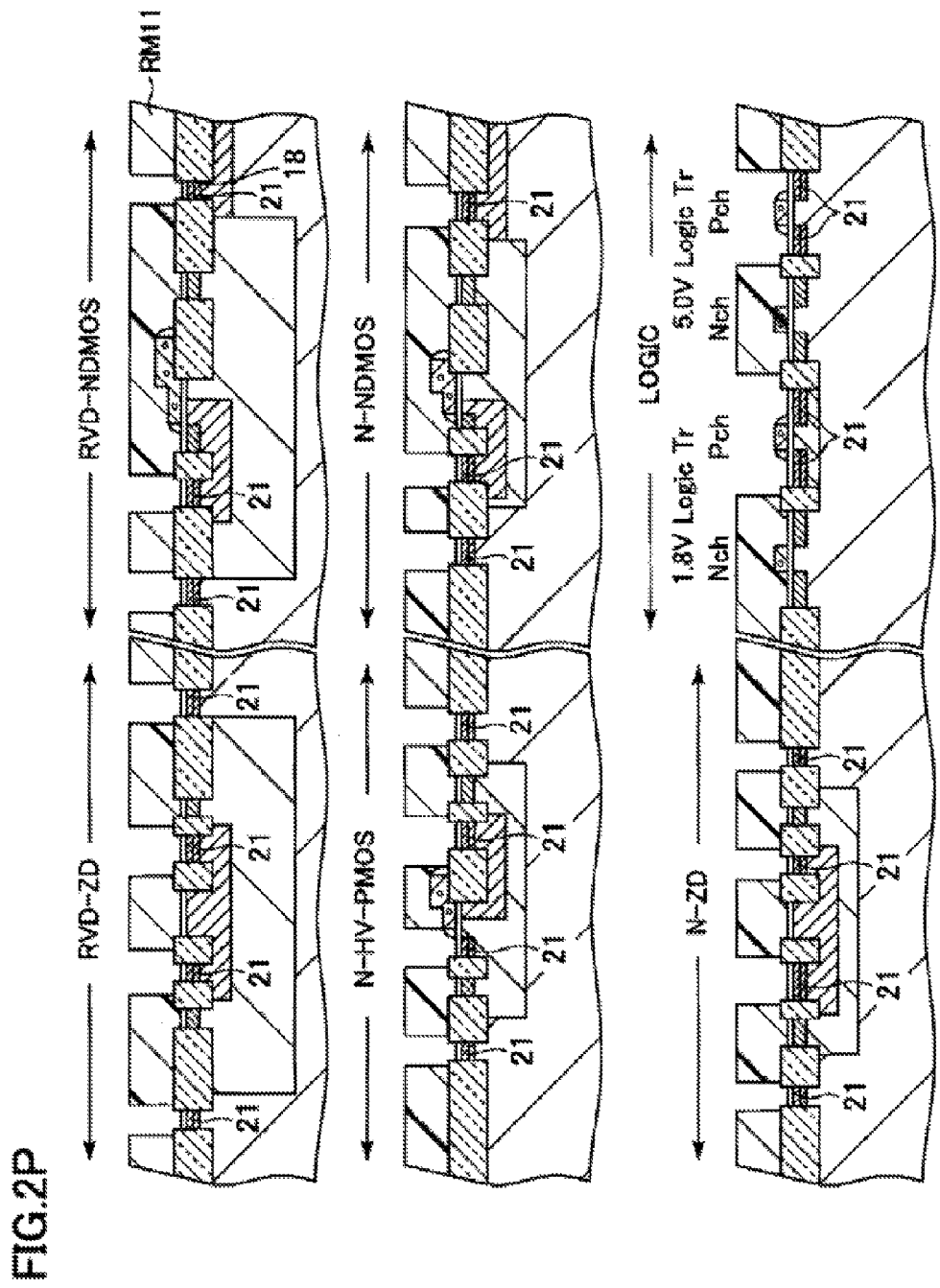

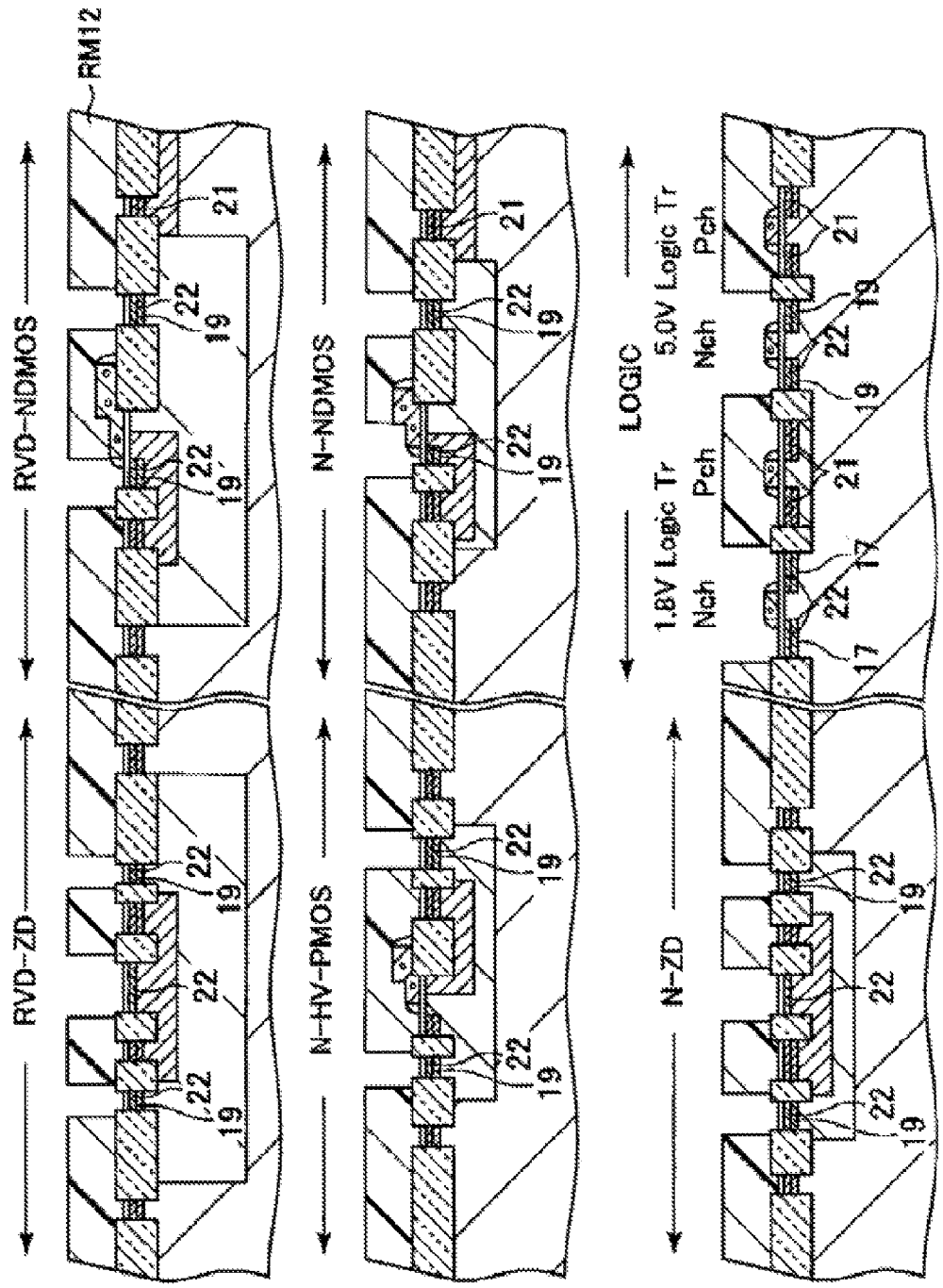

FIG. 3A N - NDMOS

FIG. 3C RVD-NDMOS

| | a | b | c | gate length d:DRFT | gx | gy | h | ix | iy | channel width W | source width S | drain width D | Pbody contact region width P |
|---|---|---|---|---|---|---|---|---|---|---|---|---|---|
| N - NDMOS | 0.24 | 1.6 | 1.0 | 2.0 | 2.0 | 1.0 | 2.0 | 3.0 | 1.0 | 5.0 | 20.0 | 0.7 | 1.7 | 0.64 |
| RVD-NDMOS | 0.24 | 1.6 | 3.0 | 4.6 | 6.0 | 2.0 | 2.0 | 9.0 | 7.0 | 11.0 | 20.0 | 0.7 | 1.7 | 0.64 |

( in μm)

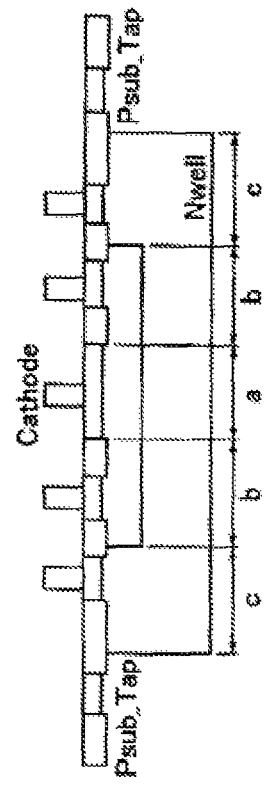
FIG. 4A N-ZD
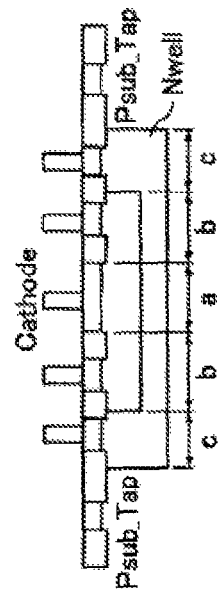
FIG. 4C RVD-ZD
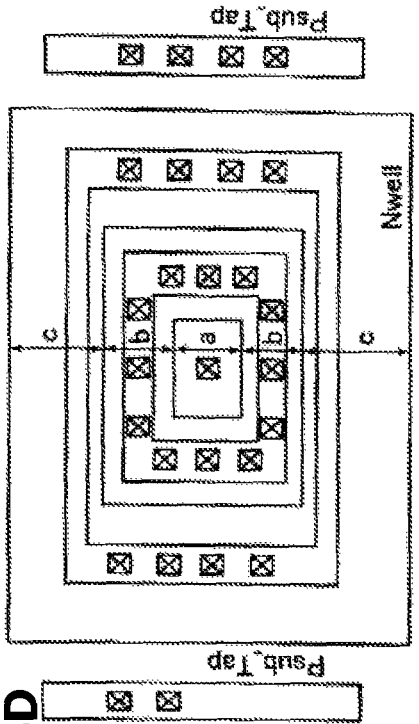
FIG. 4B
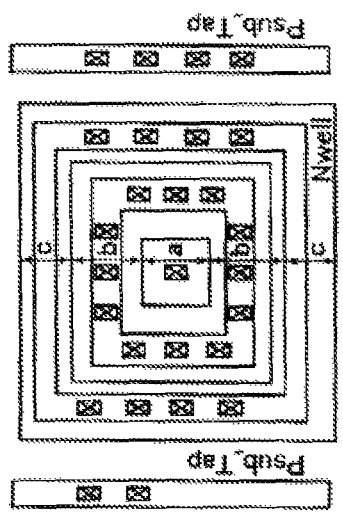
FIG. 4D
| | a | b | c |
|---|---|---|---|
| N-ZD | 2.8 | 2.0 | 3.0 |
| RVD-ZD | 2.8 | 2.0 | 9.0 |
( in um)
FIG. 4E

SEMICONDUCTOR DEVICE WITH HIGH BREAKDOWN VOLTAGE AND MANUFACTURE THEREOF

CROSS REFERENCE TO RELATED APPLICATION

This application is based upon and claims the benefit of priority of the prior Japanese Patent Application No. 2011-288084, filed on Dec. 28, 2011, the entire contents of which are incorporated herein by reference.

FIELD

The embodiments of the present invention relate to a semiconductor device and a production process thereof.

BACKGROUND

In recent years, electronic control of e.g. automobiles have been developing. Intensive efforts have been made to develop LSI chips in which digital circuits and high breakdown voltage transistors are combined into a system. DMOS (double-diffused MOS) transistor, for example, is widely known as a high breakdown voltage transistor. For example in an n-channel transistor, a p-type backgate region is formed in a surface portion of an $n^-$-type epitaxial layer, and an $n^+$-type source region is formed in the p-type backgate region. An n-type drain region is formed to oppose to the source region, sandwiching parts of the $n^-$ type epitaxial layer and the p-type backgate region in between. Such transistor structure having doubled structure of a source region and a surrounding backgate region is called DMOS transistor, even when no concentration gradient is formed by diffusion.

For example, an $n^-$-type epitaxial layer is grown on a p-type silicon substrate, and a p-type backgate region is formed in the $n^-$-type epitaxial layer. An $n^+$-type source region is formed in the p-type backgate region, and the p-type backgate region and the $n^+$-type source region are connected to be at the same electric potential. A portion of the p-type backgate region which is exposed at the surface adjacent to the source region constitutes a channel region, and an n-type drain region is formed in the $n^-$-type epitaxial layer opposing to the channel region with a LOCOS field insulation film sandwiched in between. An n-type high concentration region is formed between the channel region and the LOCOS field insulation film, and a gate insulation film is formed on the channel region and the n-type high concentration region. A gate electrode is formed on the gate insulation film, extending onto the LOCOS field insulation film. Thus, a DMOS transistor is formed. The high voltage applied to the drain region is relaxed in direction parallel to the surface by resistance of the $n^-$-type region located under the LOCOS field insulation film (for example, see, Japanese Unexamined Patent Publication (Kokai) No. 2009-239096).

Substrates manufactured by using epitaxial growth are expensive. For cost reduction, it is preferable to form a high breakdown voltage transistor without using an epitaxial substrate.

There is an on-vehicle LSI called CAN (controller area network) driver. CAN is designed for communication among electronic modules through a common bus line, and a voltage is usually supplied from a battery power supply (12 V to 24 V). Even if the LSI is disconnected from the ground due to some traveling trouble, it is required not to change the bus line potential. To meet this requirement, the DMOS transistor should withstand a voltage of reverse polarity. The capability to withstand a voltage of the polarity reverse to that of the normally applied voltage is referred to as reverse voltage durability.

SUMMARY

According to an aspect of the invention, an apparatus includes a p-type semiconductor substrate, a first n-type well formed in the p-type semiconductor substrate with a first depth from a surface of the substrate, a second n-type well formed in the p-type semiconductor substrate with a second depth from the surface of the substrate, the second depth being smaller than the first depth, a first and a second p-type backgate region formed in the first and the second n-type wells, respectively, a first and a second n-type source region formed in the first and the second p-type backgate regions, respectively, a first and a second n-type drain region formed in the first and the second n-type wells, respectively, at positions opposing to the first and the second n-type source regions, with the first and the second p-type backgate regions located in between, and field insulation films formed on surfaces of the first and the second n-type wells, at positions between the first and the second p-type backgate regions and the first and the second n-type drain regions, respectively, wherein a first transistor with a low reverse voltage durability is formed in the first n-type well and a second transistor with a reverse voltage durability higher than that of the first transistor is formed in the second n-type well.

According to another aspect of the invention, a method of manufacturing an apparatus includes forming a first n-type well by ion implantation of an n-type impurity into a p-type semiconductor substrate, diffusing the n-type impurity of the first n-type well by heat treatment, thereby forming a first enlarged n-type well with an increased depth, forming isolation films in the p-type semiconductor substrate, forming a second n-type well by ion-implantation of an n-type impurity in the p-type semiconductor substrate, the second n-type well being shallower than the first enlarged n-type well, forming a first and a second p-type backgate regions by ion-implantation of a p-type impurity in the first enlarged n-type well and the second n-type well, forming a first and a second gate electrode extending from above the first and the second backgate region onto the isolation films, forming a first and a second n-type source region by ion-implantation of an n-type impurity in the first and the second backgate regions, and forming a first and a second n-type drain region by ion-implantation of an n-type impurity at positions opposing to the first and the second n-type source regions with the first and second backgate regions and the field insulation films in the first enlarged n-type well and the second n-type well located in between.

The object and advantages of the invention will be realized and attained by means of the elements and combinations particularly pointed out in the claims.

It is to be understood that both the foregoing general description and the following detailed description are exemplary and are not restrictive of the invention, as claimed.

BRIEF DESCRIPTION OF DRAWINGS

FIGS. 3A and 3B are a cross section and a partially broken-out plan view of a normal high voltage NDMOS transistor, FIGS. 3C and 3D are a cross section and a partially broken-out plan view of a reverse voltage durable, high breakdown voltage NDMOS transistor.

FIGS. 4A and 4B are a cross section and a partial broken-out plan view of a Zener diode for protection of normal high voltage NMOS transistor, FIGS. 4C and 4D are a cross section and a partial broken-out plan view of a Zener diode for protection of reverse voltage durable, high breakdown voltage NMOS transistor, and FIG. 4E is a table listing comparative values of dimensions a, b, and c.

DESCRIPTION OF EMBODIMENTS

Figure 1:
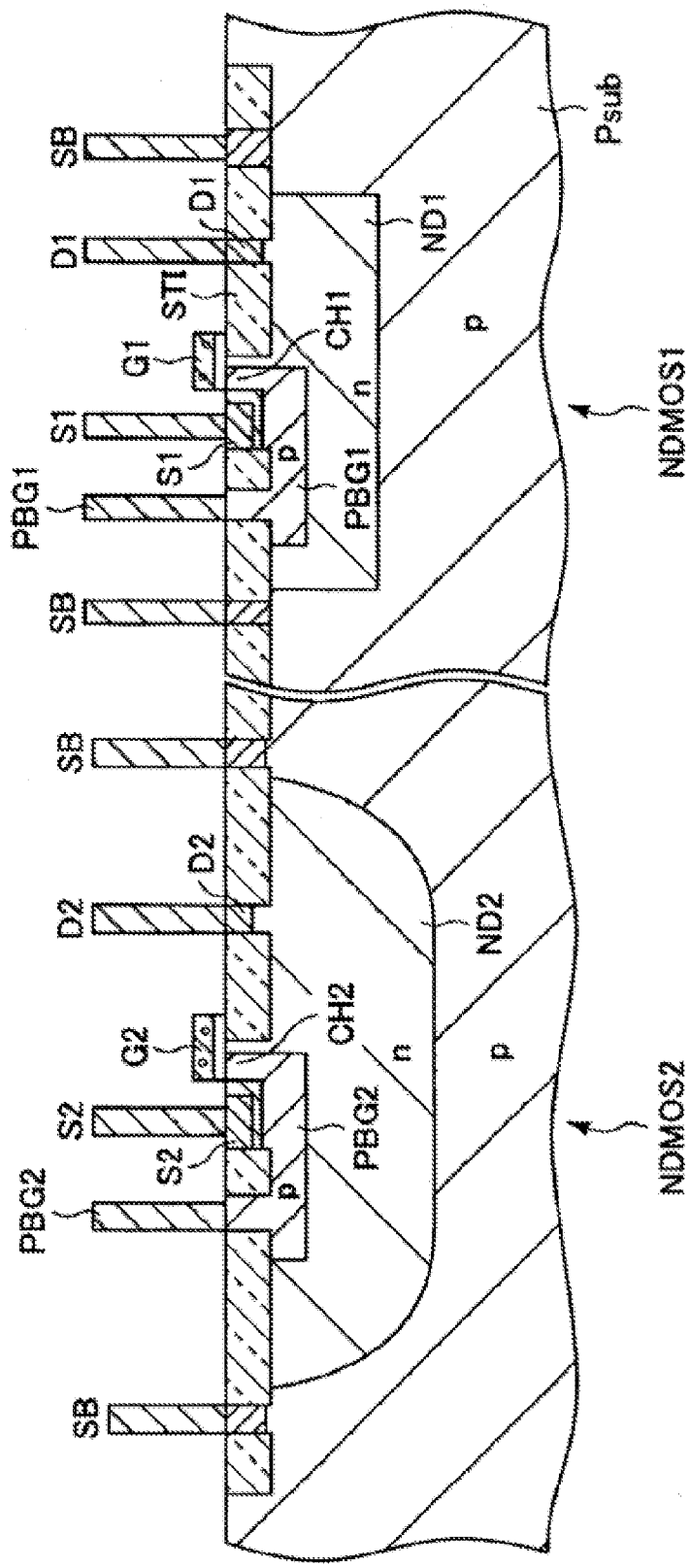
FIG. 1 is a cross section illustrating two basic constitutions of high breakdown voltage DMOS transistor according to an embodiment of the invention.

FIG. 1 illustrates two different n-type DMOS transistors formed on a p-type silicon substrate.

As illustrated in right-hand part of FIG. 1, an n-type drift region ND1 is formed by ion implantation at a high acceleration energy. Commonly available ion implantation equipment has a maximum acceleration energy of about 2 MeV. In case of implanting $P^+$ ions, ion implantation can form an n-type region with a depth as deep as about 2.5 µm. Shallow trench isolation (STI) of, for example, silicon oxide is formed on a surface of a silicon substrate Psub, by generally known method, which may serve as a field insulation film, a device isolation region, etc. Since manufacture of STI does not require high temperature treatment which accompanies impurity diffusion, the order of process steps may be changed in various ways.

P-type impurities are implanted in the n-type drift region ND1 to form a p-type backgate well PBG1. An n-type source region S1 is formed in the p-type backgate well PBG1. Surface portion of the p-type backgate well PBG1 sandwiched between the n-type source region S1 and the n-type drift region ND1 can constitute a channel region CH1. An n-type drain region D1 is disposed in the n-type drift region ND1 on that side of the channel region CH1 via STI, which is opposite to the n-type source region S1. A gate electrode G1 is formed in such a manner that it covers the channel region CH1 and extends onto the STI region. Hereinafter, an electrode connected to a semiconductor region will be given a same symbol as the semiconductor region. A substrate bias electrode SB is connected to the p-type substrate Psub. Thus, a high breakdown voltage DMOS transistor is formed.

Assume here that this high breakdown voltage DMOS transistor is disconnected from ground due to some cause or error. The drain D1 is applied with a voltage, for example, equivalent to the power source voltage (12 V-24 V), and if the substrate is disconnected from the ground, the substrate voltage will increase under the influence of high-voltage regions up to a voltage equivalent to the power source voltage (12 V-24 V). The voltages at terminals connected to other LSIs will be kept at about 0 V to 4.1 V depending on the normal voltage states of other devices. Accordingly, the voltage at such a terminal becomes lower than the substrate voltage. It appears that the terminal receives a negative voltage. If it cannot withstand a negative voltage, a power source bias may be applied from the substrate to the terminal, to disturb communication with other LSIs, and may even cause destruction of some part in the worst case.

A high voltage will be applied to the drain D1, and in most cases, the p-type backgate well PBG1 and the p-type substrate Psub will usually be at about the ground potential, i.e. at nearly the same potential. Accordingly, the device does not require capability of withstanding high voltage between the p-type backgate well PBG1 and the p-type substrate Psub. If the ground is disconnected or floated, however, the potential on the p-type substrate Psub will become nearly equal to the power source potential (12 V-24 V), and the p-type backgate well PBG1 will have a potential nearly equal to the ground. If the p-type backgate well PBG1 and the p-type substrate Psub are located at a small distance from each other, the n-type drift region ND1 located therebetween will be easily punched through.

For the device to be durable against a negative potential that takes place when a ground failure occurs to increase the substrate potential, it is desired to prevent the n-type drift region from being punched through. An increase in the impurity concentration in the n-type drift region will give adverse influence on the high breakdown property. It is desirable to increase the distance between the p-type backgate well PBG and the p-type substrate Psub. When the n-type drift region is formed by ion implantation, the depth of the n-type drift region is limited by the available acceleration energy. An effective way to form a deeper n-type drift region is to perform thermal diffusion after ion implantation.

As illustrated in left-hand part of FIG. 1, ion implantation for a second n-type drift region ND2 is carried out first, and then the impurity distribution is broadened by thermal diffusion to form a deeper n-type drift region ND2. For example, $P^+$ ion is implanted at an acceleration energy of 2 MeV, and then heat treatment is performed at 1,150° C. for 6 hours to diffuse the implanted impurities, thereby forming a second n-type drift region ND2 having a depth of the order of 8 µm. Thermal diffusion occurs in the in-plane direction, as well as in the depth direction simultaneously, thus increasing the sizes of the second n-type drift region ND2. For example, the second n-type drift region, which remain after the formation of the backgate well, is designed to have a thickness which cannot be punched through even when the power source voltage is applied in the thickness direction. Formation of a device isolation region STI may be carried out, for example, at this stage.

$P^+$ ion implantation is performed again at an acceleration energy of 2 MeV to form a first n-type drift region ND1 as illustrated in the right-hand part of FIG. 1. A small first n-type drift region ND1 can be formed. Subsequently, the steps described above with reference to the DMOS transistor depicted in the right-hand part of FIG. 1 are carried out to form, for example, p-type backgate wells PBG1 and PBG2, gate electrodes G1 and G2, n-type source regions S1 and S2, n-type drain regions D1 and D2, and substrate bias regions SB.

Punching-through between the backgate region PBG2 and the substrate Psub can be prevented as a result of an increase in the thickness of the second n-type drift region ND2 sandwiched between the p-type backgate well PBG2 and the p-type substrate Psub.

In this way, a high breakdown voltage DMOS transistor NDMOS2 with reverse voltage durability can be manufactured, and a high breakdown voltage DMOS transistor NDMOS1 without need for reverse voltage durability can be manufactured in a small area. Since a normal substrate without having an epitaxial layer can be used, manufacturing cost can be suppressed, and design resources for formation of circuits using normal substrates can also be utilized.

More detailed description will be made on the manufacturing method of a semiconductor device according to an embodiment. For instance, a p-type silicon substrate Psub with a resistivity of 10 Ωcm is prepared. For example, six regions, namely, reverse voltage durable (RVD) Zener diode (ZD) formation region, reverse voltage durable NDMOS formation region, normal high voltage (N-HV) PMOS formation region, normal NDMOS formation region, normal Zener diode (ZD) formation region, and logic transistor formation region, are assigned in the p-type silicon substrate. As an example, description will be made on a case where 1.8V-driven logic transistors and 5.0V-driven logic transistors are formed in the logic transistor formation region.

Figure 2A:
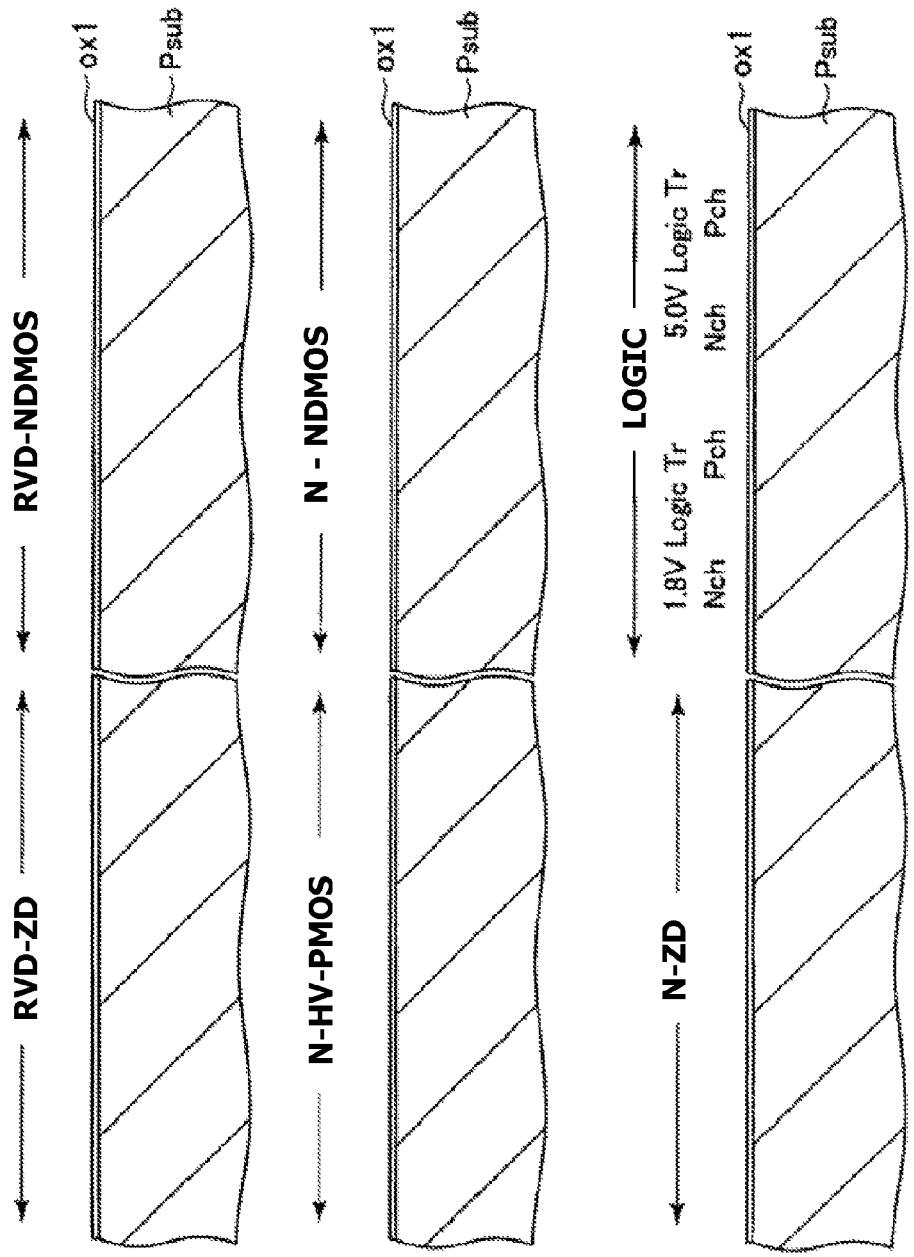
FIGS. 2A-2S are cross sections illustrating major steps of a process for manufacturing a semiconductor device including a plurality of semiconductor elements of different types according to an embodiment of the invention.

In FIG. 2A, the reverse voltage durable Zener diode (ZD) formation region and rhe reverse voltage durable NDMOS formation region are depicted in the upper part, the normal high voltage PMOS formation region and the normal NDMOS formation region are depicted in the middle part, and the normal Zener diode (ZD) formation region and the logic transistor formation region are depicted in the lower part. These six regions ate assigned on one p-type silicon substrate Psub. The six regions will be depicted at the same positions in all subsequent figures. A silicon oxide film having a thickness of the order of 10 nm is grown on the surface of the p-type silicon substrate Psub, by thermal oxidation to serve as a substrate protection oxide film ox1.

Figure 2B:
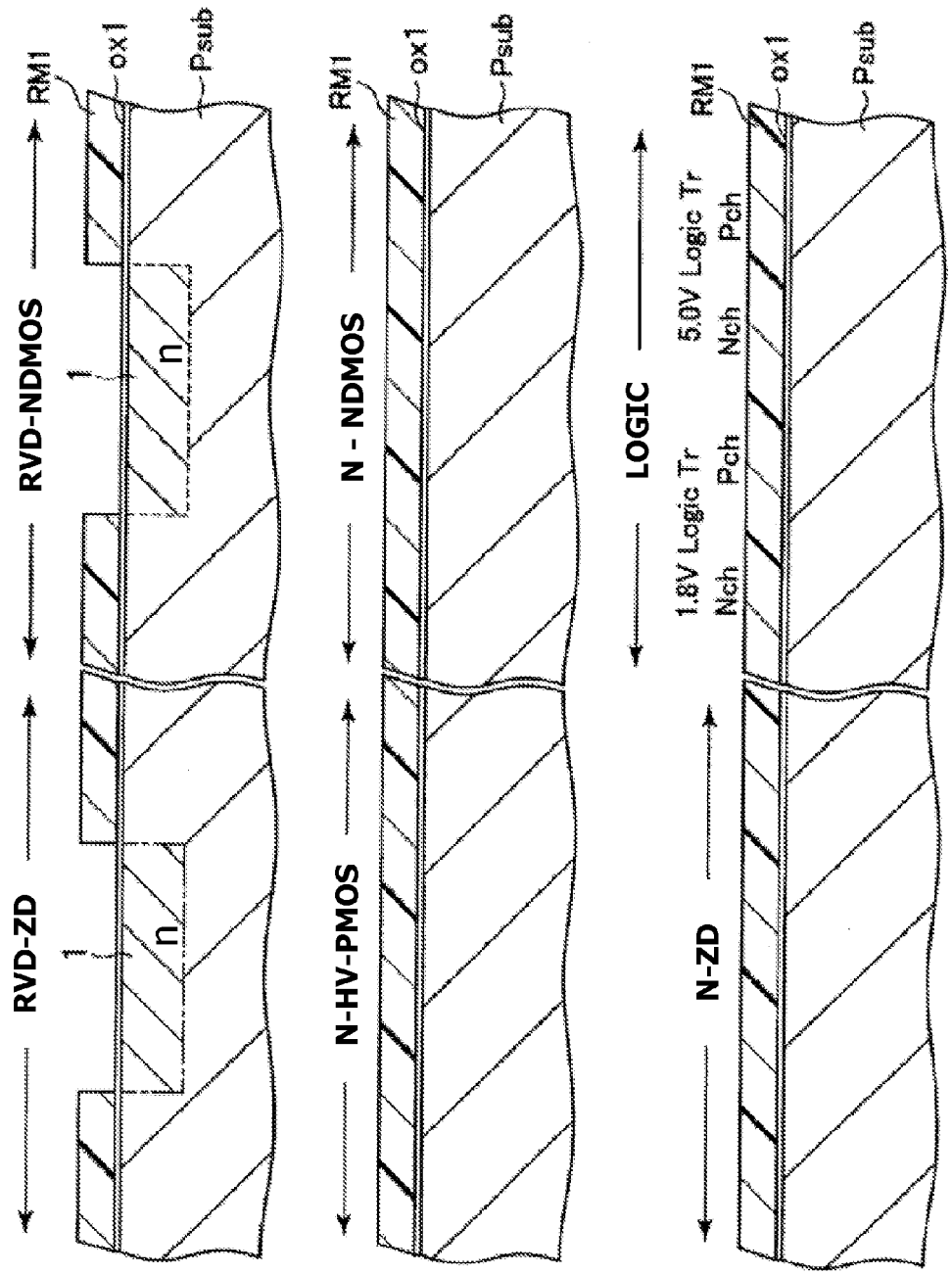

As depicted in FIG. 2B, a resist mask RM1 having openings in the reverse voltage durable NDMOS formation region and in the reverse voltage durable Zener diode region is formed, and $P^+$ ion is implanted at an acceleration energy of 2 MeV and a doze of $4.0 \times 10^{12}$ cm$^{-2}$ to form n-type wells 1 having a depth of about 2.5 μm. Subsequently, the resist mask RM1 is removed.

As depicted in FIG. 2C, thermal diffusion treatment is carried out at 1,150° C. for 6 hours in nitrogen atmosphere so that the n-type wells 1 are diffused to form n-type wells 2 having a depth of about 8 μm. An n-type well 2 in the reverse voltage durable NDMOS region functions as an n-type drift region ND2 as depicted in FIG. 1. Here, an n-type well with a depth of about 8 μm is formed, aiming to obtain a reverse voltage durability of −35V. If the required durability is lower, the depth may be smaller and/or the heat treatment conditions may be relaxed. Then, the substrate protection oxide film ox1 is removed, for example, by dilute hydrofluoric acid. A new silicon oxide film with a thickness of, for example, about 15 nm is grown by thermal oxidation at 900° C. to serve as a substrate protection film ox2.

Figure 2D:
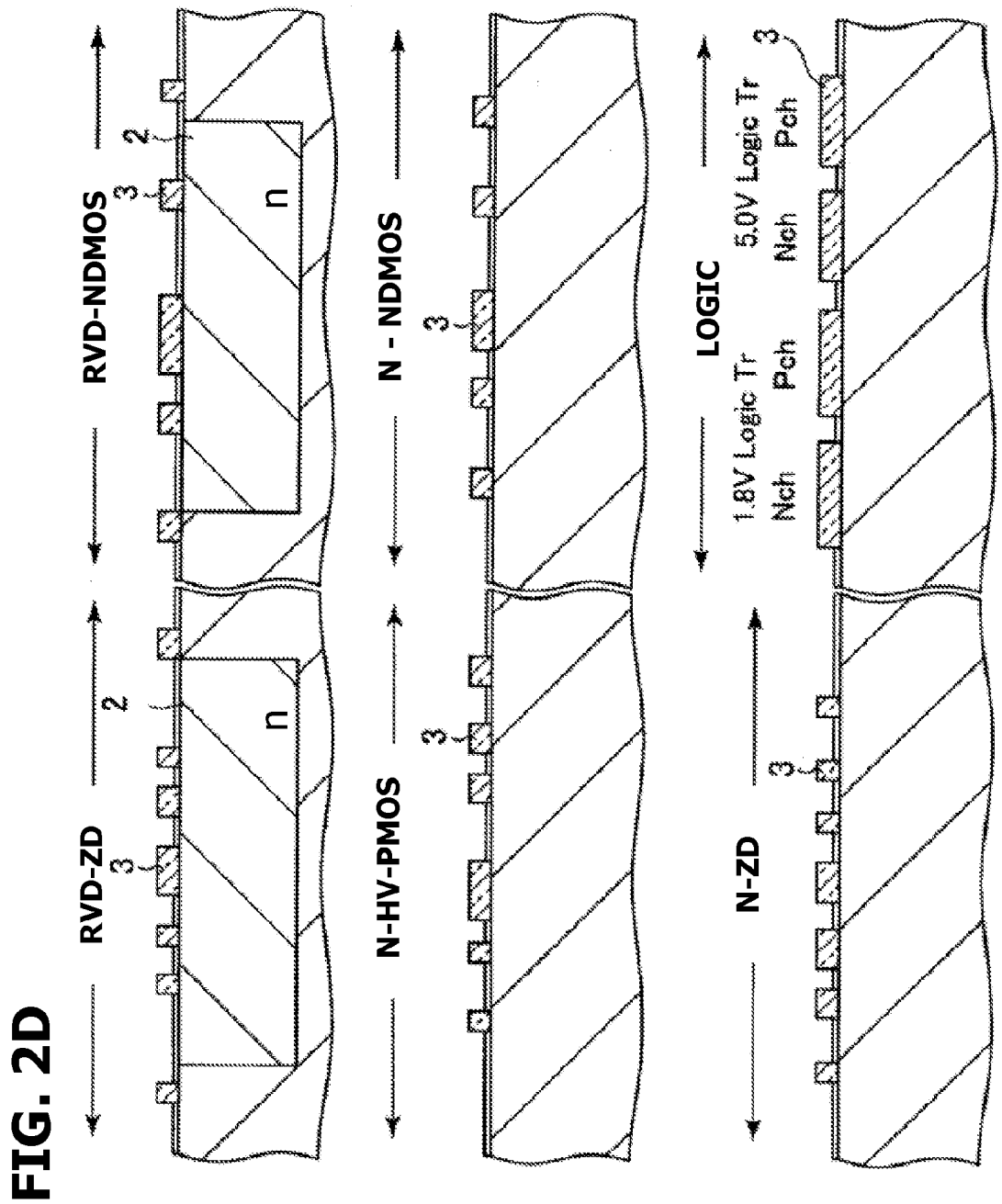

As depicted in FIG. 2D, a silicon nitride film having a thickness of about 150 nm is grown by chemical vapor deposition (CVD) and to form a hard mask 3 having openings in the regions corresponding to field oxide films and device isolation regions through etching by hot phosphoric acid using a resist pattern, etc. The oxide film ox2 under the hard mask 3 is jointly illustrated with (as part of) the hard mask.

Figure 2E:
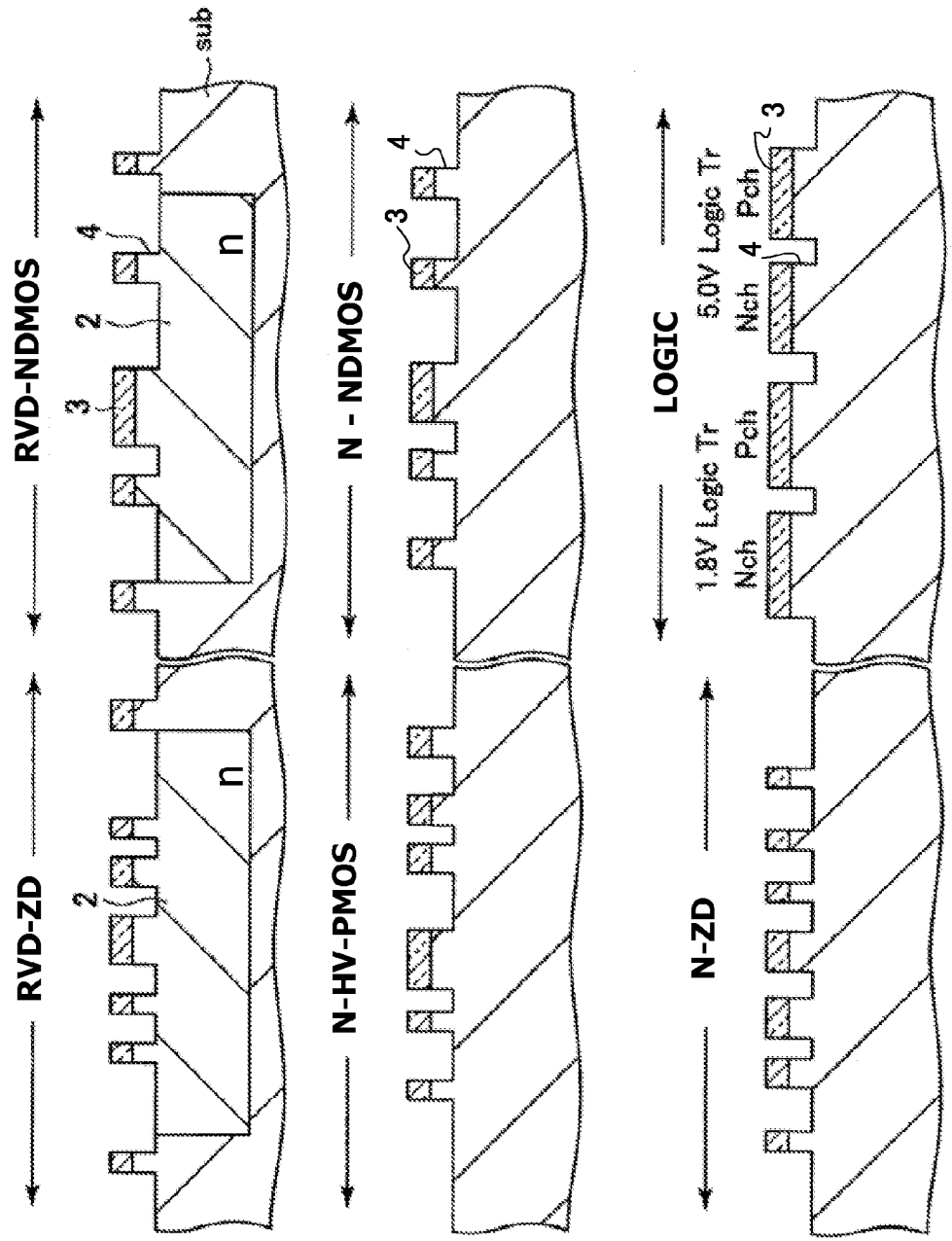

As depicted in FIG. 2E, the exposed portions of the substrate protection film ox2 are removed by using the hard mask 3 of silicon nitride film as an etching mask, and the thus exposed portions of the silicon substrate are etched to form trenches 4 with a depth of about 350 nm.

Figure 2F:
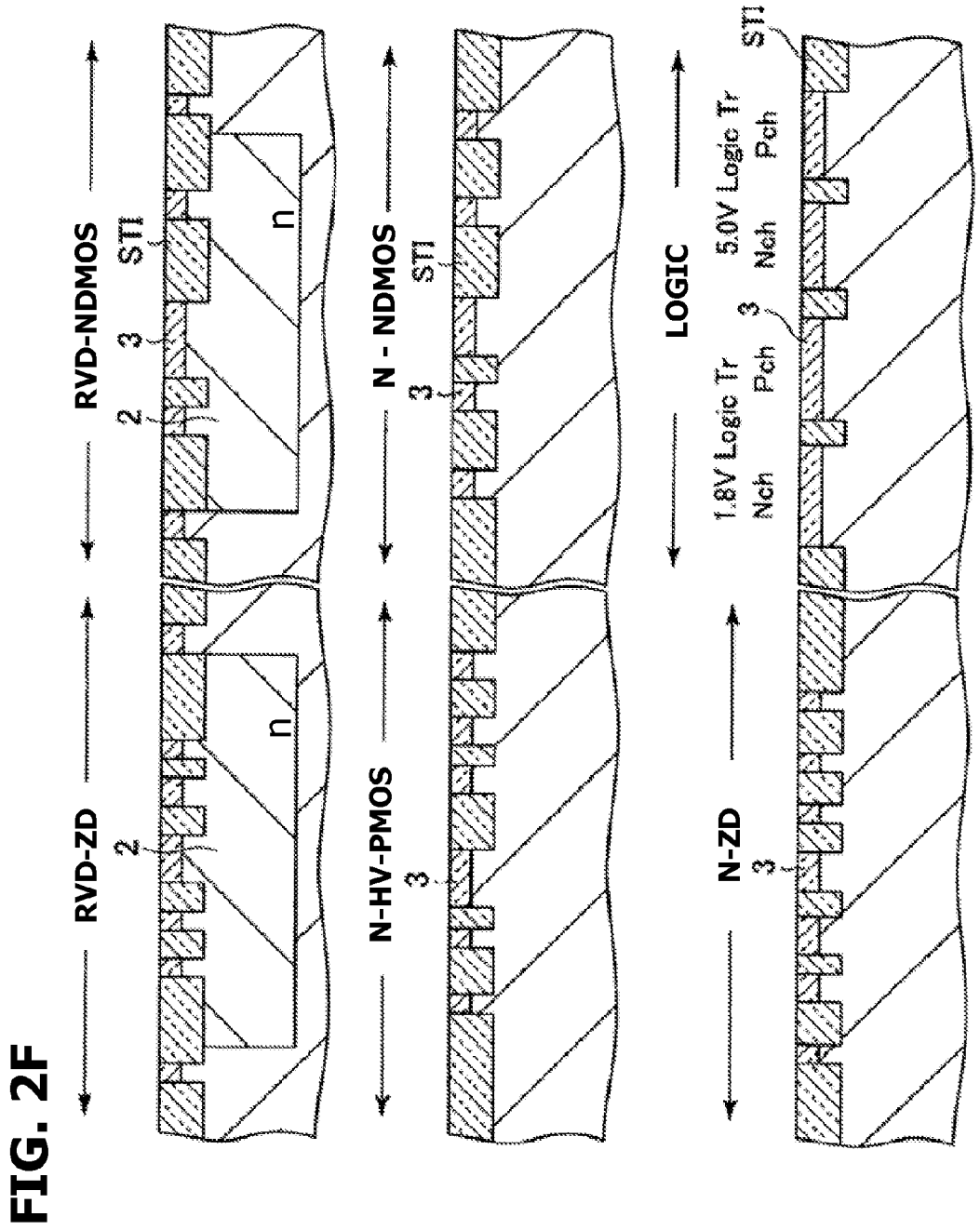

As depicted in FIG. 2F, the silicon substrate Psub provided with trenches is subjected to annealing (thermal oxidation) at 1,100° C. in an oxidizing atmosphere to form a thermal oxide film liner having a thickness of about 40 nm. Subsequently, a silicon oxide film with a thickness of, for example, 675 nm is grown by high density plasma (HDP) CVD to fill and embed the trenches, followed by polishing and removing unnecessary portions above the hard mask 3 by chemical mechanical polishing (CMP) to form shallow trench isolation (STI) type field oxide films and/or isolation regions STI.

Figure 2G:
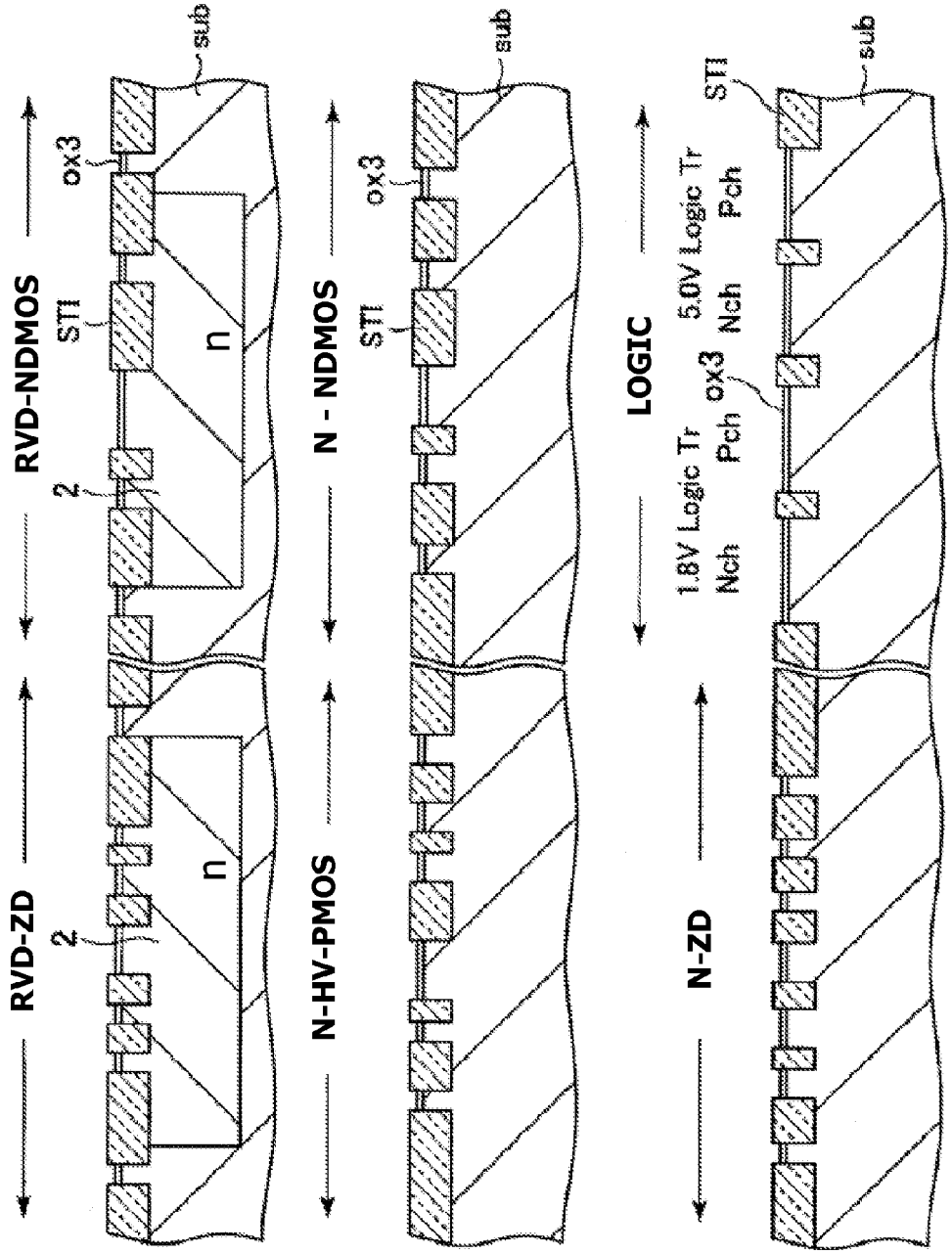

As depicted in FIG. 2G, the hard mask 3 of silicon nitride is removed by hot phosphoric acid, and the substrate protection film ox2 of silicon oxide thus exposed is removed by diluted hydrofluoric acid. The silicon substrate surface thus exposed is subjected to thermal oxidation at 900° C. in an oxidizing atmosphere to form a substrate protection film ox3 of silicon oxide film having a thickness of about 10 nm.

Figure 2H:
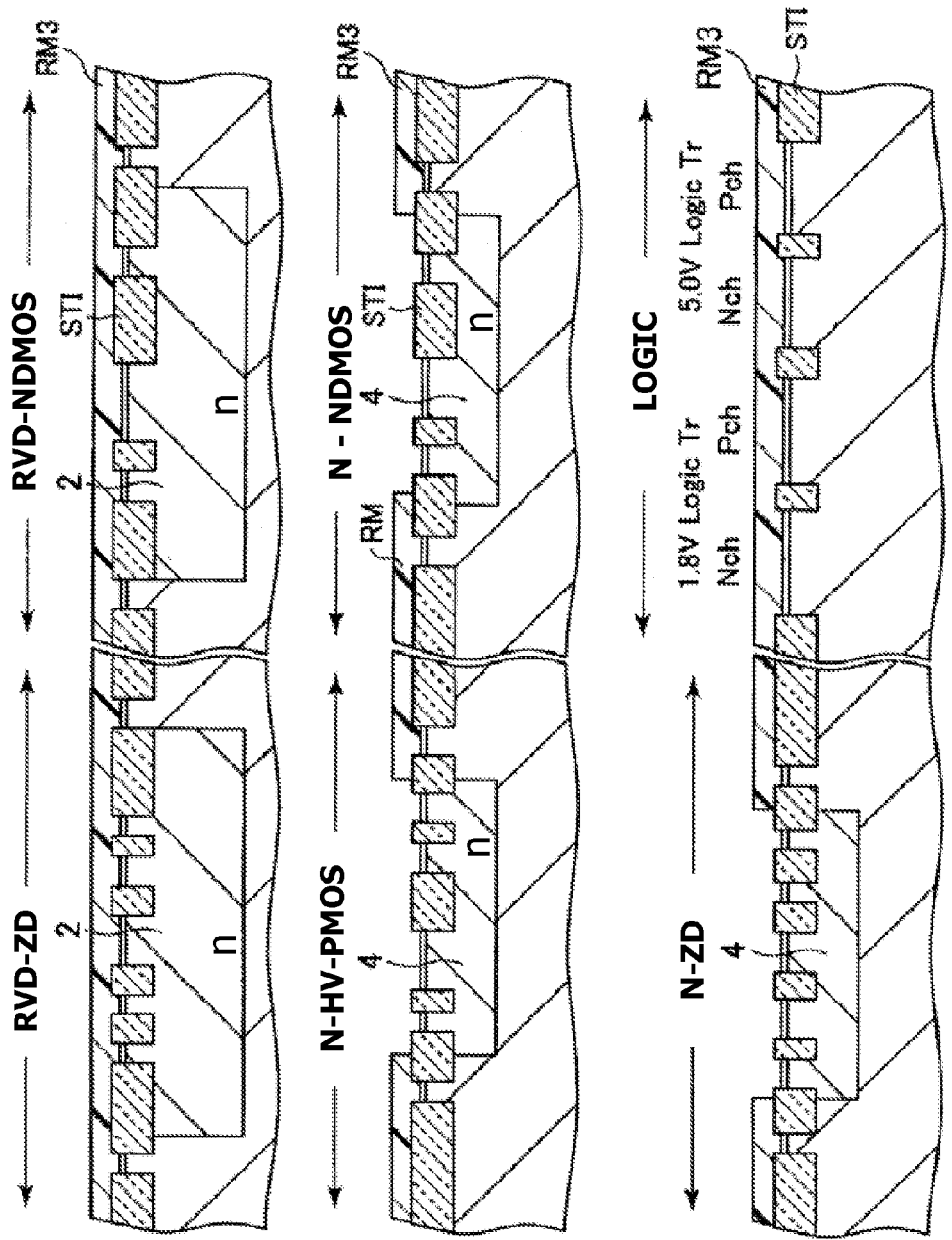

As depicted in FIG. 2H, a resist mask RM3 having openings in the regions where n-type wells are to be formed in the normal high voltage PMOS transistor, the normal NDMOS transistor, and the normal Zener diode, is formed on the surface of the silicon substrate Psub, and $P^+$ ion implantation is carried out at an acceleration energy of 2 MeV and a doze of $2.5 \times 10^{12}$ cm$^{-2}$, and at an acceleration energy of 500 keV and a dose of $1.5 \times 10^{12}$ cm$^{-2}$ to form an n-type wells 4 having a depth of about 2.5 μm. The n-type well 4 in the normal NDMOS transistor functions as an n-type drift region ND1 as depicted in FIG. 1. Subsequently, the resist mask RM3 is removed.

Figure 2I:
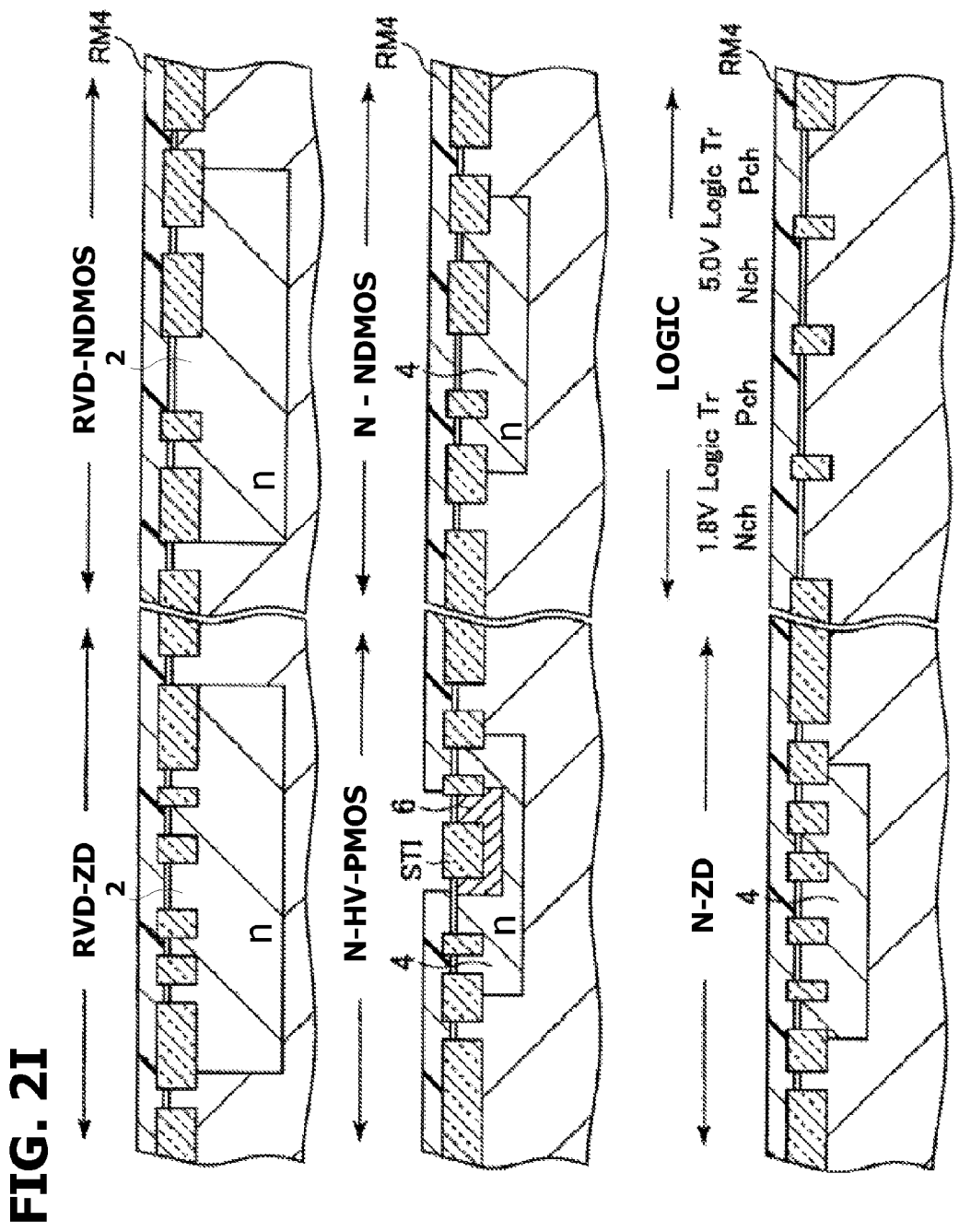

As depicted in FIG. 2I, a resist mask RM4 having an opening in the p-type drift region of a normal high voltage PMOS transistor is formed on a silicon substrate Psub, and $B^+$ ion implantation is carried out at an acceleration energy of 150 KeV and a doze of $5.5 \times 10^{12}$ cm$^{-2}$ to form a p-type well that acts as a p-type drift region 6 in a normal high voltage PMOS transistor. Subsequently, the resist mask RM4 is removed.

Figure 2J:
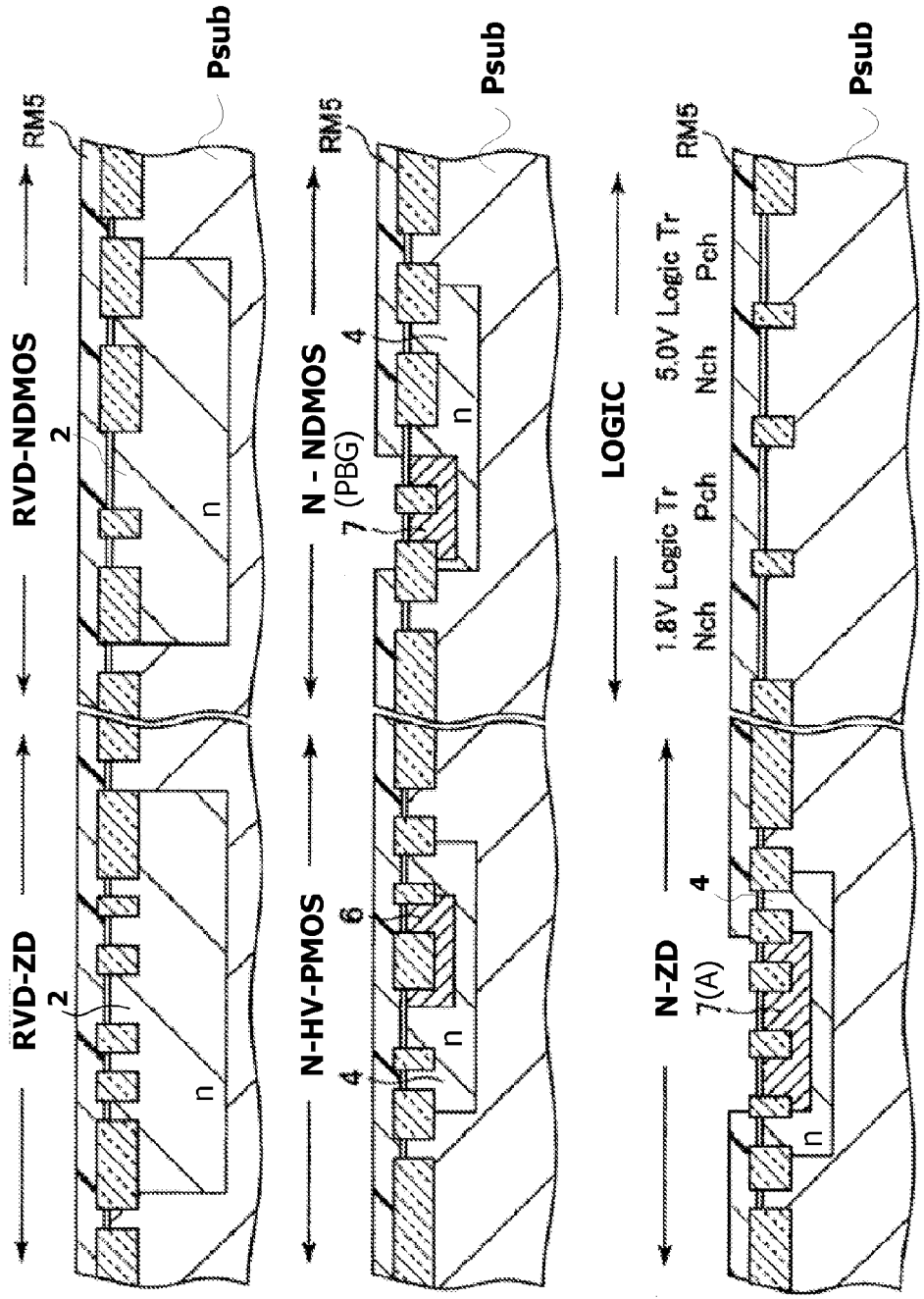

As depicted in FIG. 2J, a resist mask RM5 having openings in regions where a p-type backgate (PBG) well of a normal NDMOS transistor and a p-type well for the anode (A) of a normal Zener diode are to be formed is formed, and three runs of $B^+$ ion implantation are carried out, at an acceleration energy of 420 keV and a doze of $1.2 \times 10^{13}$ cm$^{-2}$, at an acceleration energy of 150 keV and a doze of $5.0 \times 10^{12}$ cm$^{-2}$, and at an acceleration energy of 15 keV and a doze of $1.0 \times 10^{13}$ cm$^{-2}$, to form p-type well regions 7. Subsequently, the resist mask RM5 is removed. Thus, a p-type backgate (PBG) well 7 of the normal NDMOS transistor and a p-type well 7 for the anode (A) of the normal Zener diode are formed with a depth of about 1.5 μm. The n-type well 4 left below the p-type well 7 has a size of about 1 μm in the depth direction.

Figure 2K:
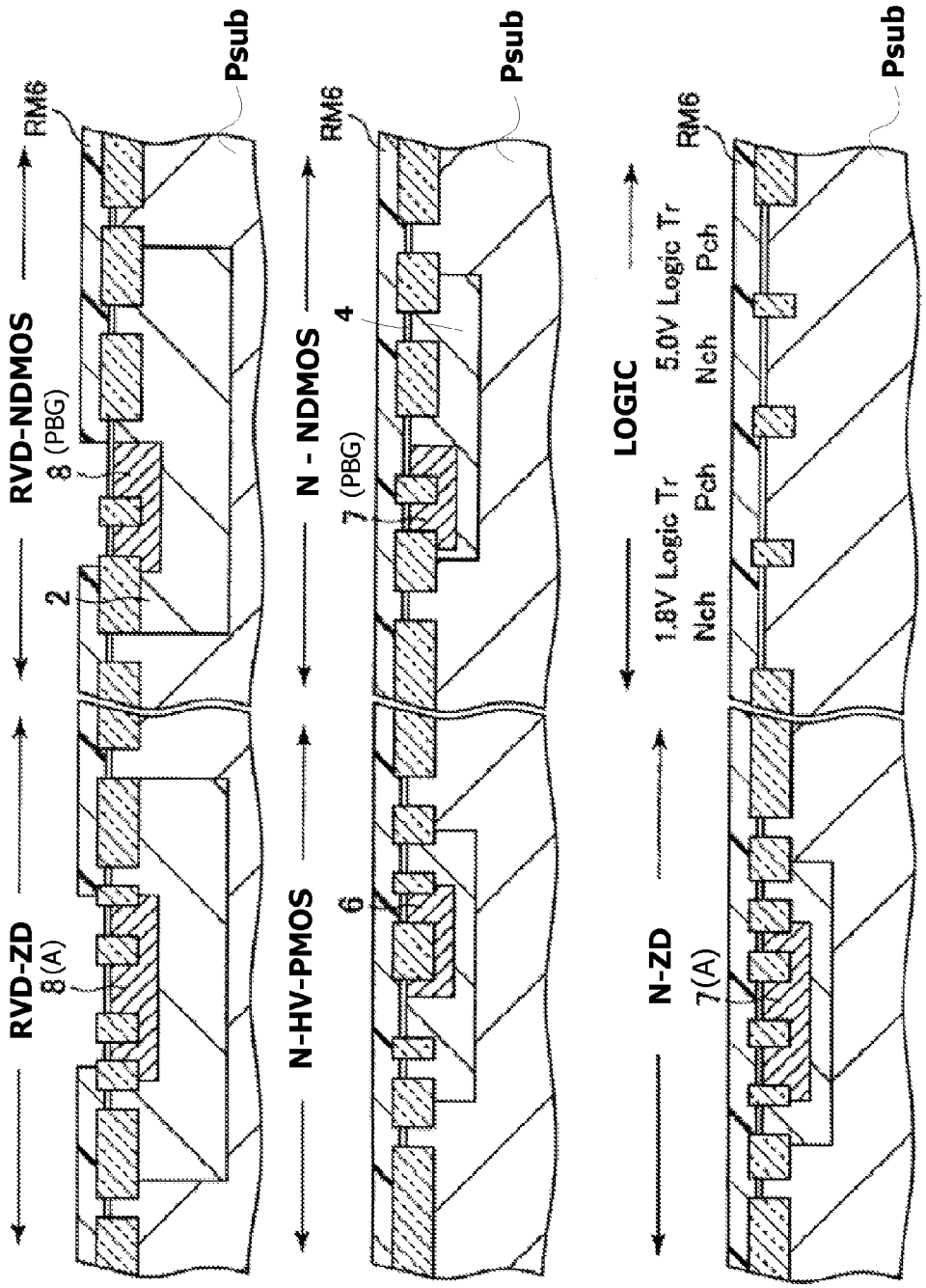

As depicted in FIG. 2K, a resist mask RM6 having openings in regions where a p-type backgate well of the reverse voltage durable NDMOS transistor and a p-type well for the anode (A) of the reverse voltage durable Zener diode are to be formed is formed, and three runs of $B^+$ ion implantation are carried out, at an acceleration energy of 420 keV and a doze of $1.6 \times 10^{13}$ cm$^{-2}$, at an acceleration energy of 150 keV and a doze of $5.0 \times 10^{12}$ cm$^{-2}$, and at an acceleration energy of 15 keV and a doze of $1.0 \times 10^{13}$ cm$^{-2}$, to form p-type well regions 8. Subsequently, the resist mask RM6 is removed. The p-type regions having a depth of about 3.0 μm are formed where a p-type backgate (PBG) well 8 of the reverse voltage durable NDMOS transistor and a p-type well 8 for the anode (A) of the reverse voltage durable Zener diode are to be formed. The n-type well 2 left below the p-type well 8 has a size of about 5 μm in the depth direction.

It is possible to form a high reverse voltage durable NDMOS structure with a separation distance of about 5 μm from the p-type substrate Psub to the p-type backgate (PBG) region 8 and a low reverse voltage durable DMOS with a separation distance of about 1 µm from the p-type substrate Psub to the p-type backgate (PBG) region 7. The p-type backgate well 8 of the reverse voltage durable NDMOS transistor is deeper than the p-type backgate well 7 of the normal NDMOS transistor. The n-type well 2 below the p-type backgate well 8 is thicker than the n-type well 4 below the p-type well 7.

Figure 2L:
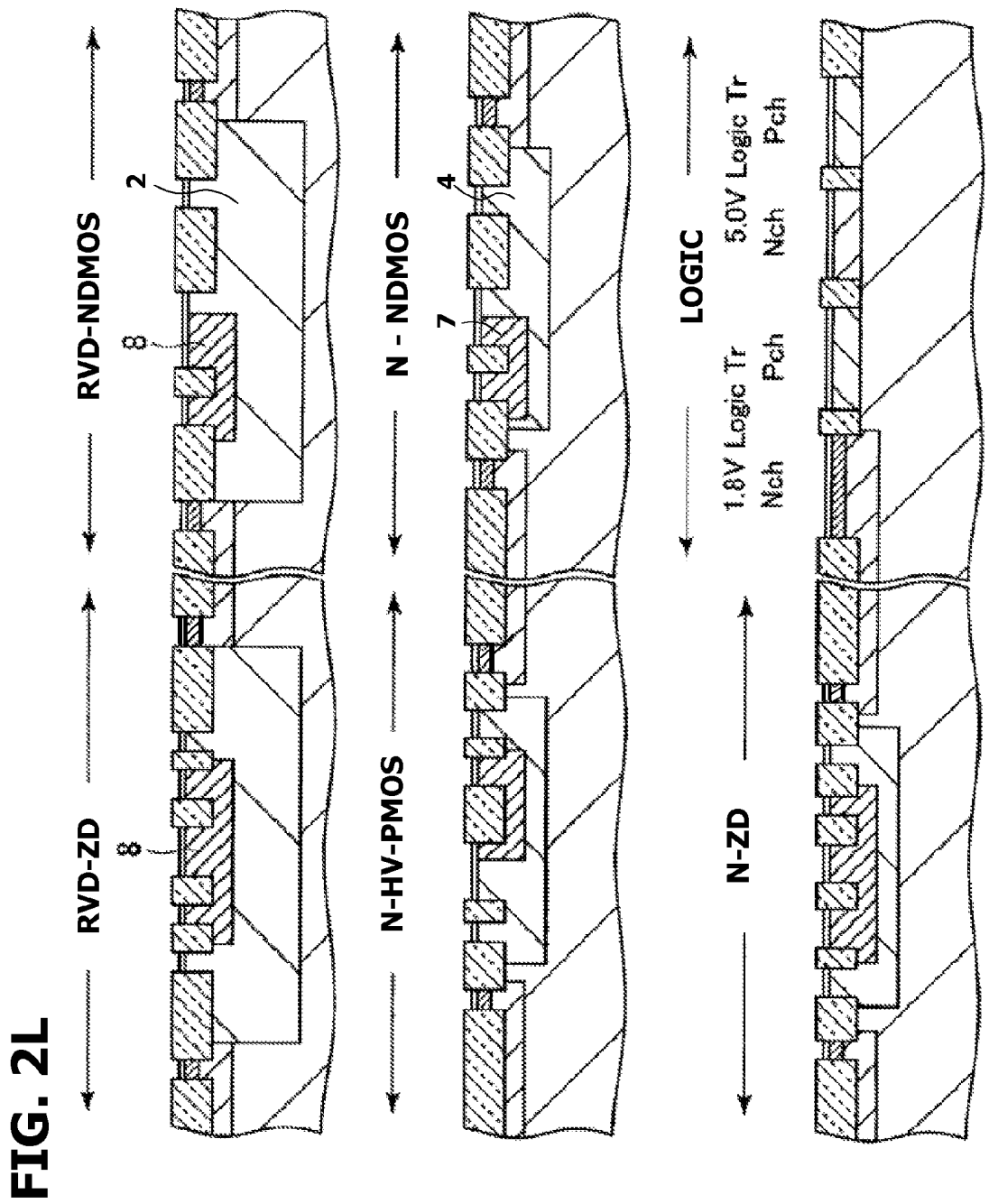

As depicted in FIG. 2L, p-type wells and n-type wells for 5V-driven and 1.8V-driven CMOS transistors are ion-implanted using respective resist masks. In a region for 5V-driven NMOS transistor, for example, $B^+$ ion is implanted at an acceleration energy of 420 keV and a doze of $2.0\times10^{13}$ cm$^{-2}$ and at an acceleration energy of 15 keV and a doze of $4.0\times10^{12}$ cm$^{-2}$. $P^+$ ion implantation is carried out at an acceleration energy of 2 MeV and a doze of $2.0\times10^{13}$ cm$^{-2}$. In a region for 5V-driven PMOS transistor, $P^+$ ion is implanted at an acceleration energy of 600 keV and a doze of $2.0\times10^{12}$ cm$^{-2}$, and at an acceleration energy of 60 keV and a doze of $4.9\times10^{12}$ cm$^{-2}$. Description is made on a case where an inversion preventing region is formed around a device isolation region. Annealing is carried out at $1{,}000°$ C. for 10 seconds in nitrogen atmosphere to activate the implanted impurities.

Similarly, for example in the region for a 1.8V-driven NMOS transistor, $B^+$ ion is implanted at an acceleration energy of 230 keV and a doze of $3.0\times10^{13}$ cm$^{-2}$. In the region for a 1.8V-driven PMOS transistor, $P^+$ ion is implanted at an acceleration energy of 500 keV and a doze of $2.8\times10^{13}$ cm$^{-2}$, and further $As^+$ ion is implanted at an acceleration energy of 180 keV and a doze of $6.5\times10^{12}$ cm$^{-2}$. Furthermore for threshold control of the 1.8V-driven NMOS transistor, $B^+$ ion is implanted at an acceleration energy of 13 keV and a doze of $1.6\times10^{13}$ cm$^{-2}$. For threshold control of the 1.8V-driven PMOS transistor, $As^+$ ion is implanted at an acceleration energy of 60 keV and a doze of $1.3\times10^{13}$ cm$^{-2}$. Annealing is carried out at $1{,}000°$ C. for 10 seconds in nitrogen atmosphere to activate the implanted impurities.

Here, the logic transistors have well known structures. They can be formed by generally known manufacturing processes. Various publicly known modifications and/or substitutions may also be adopted.

Figure 2M:
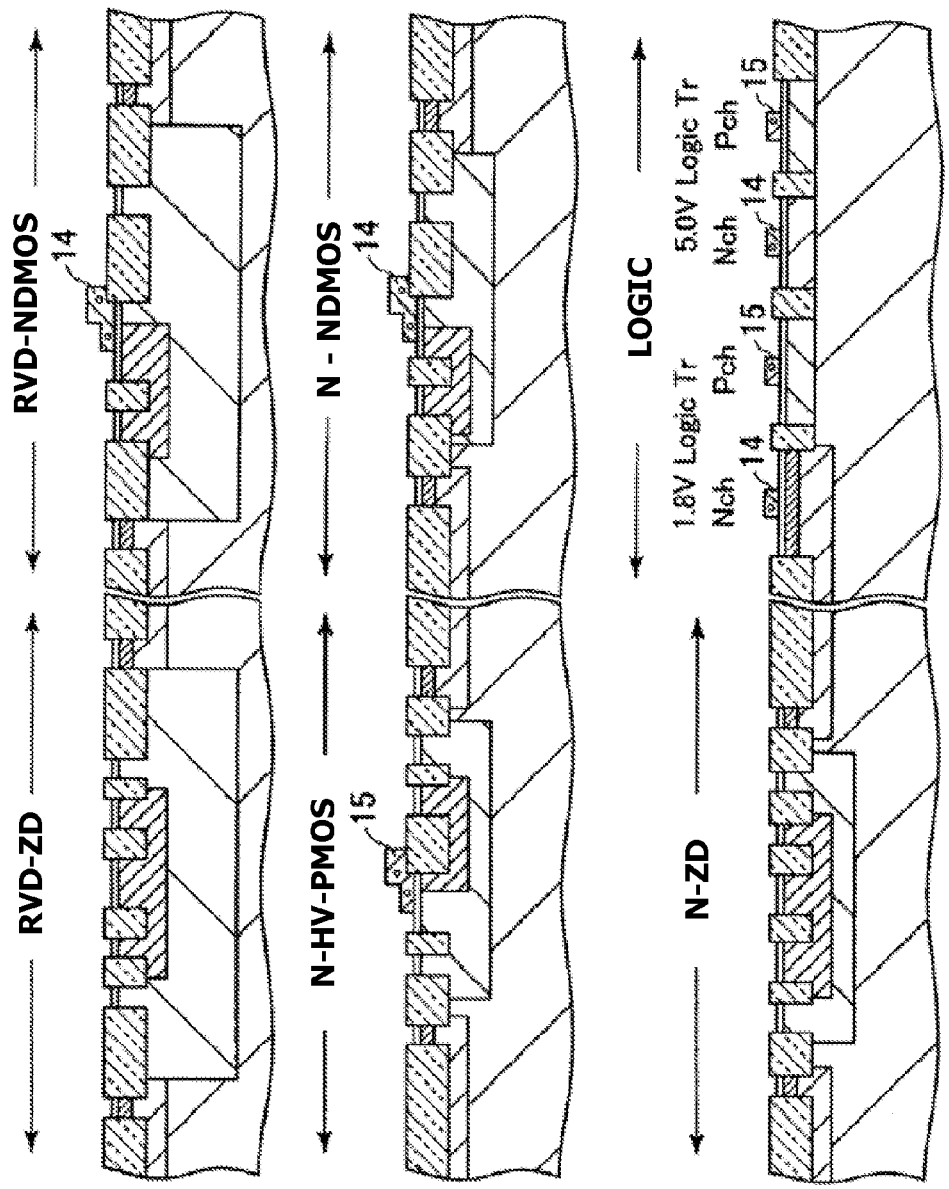

As depicted in FIG. 2M, the previously formed 10 nm-thick substrate protection film of silicon oxide is removed by hydrofluoric acid solution, and the surface of the silicon substrate is subjected to thermal oxidation at $800°$ C. in a wet oxidizing atmosphere to grow a silicon oxide film having a thickness of 15 nm. In the 1.8V-driven MOS transistor region, the silicon oxide film is once removed by hydrofluoric acid solution, and the surface of the silicon substrate is subjected to thermal oxidation in a wet oxidizing atmosphere to grow a new silicon oxide film having a thickness of 3.2 nm. The previously formed 15 nm-thick silicon oxide film increases in thickness, resulting in a silicon oxide film with a thickness of 18 nm.

Subsequently, a polysilicon film having a thickness of 180 nm is grown by CVD over the entire surface of the substrate. Using a resist mask, an n-type impurity is ion-implanted in a polysilicon film which should become n-type, and a p-type impurity is ion-implanted in a polysilicon film which should become p-type. Annealing is carried out at $800°$ C. for 60 seconds in nitrogen atmosphere to activate the impurities implanted in the polysilicon film. A resist mask is formed on the polysilicon film, and the polysilicon film is etched using the resist mask as etching mask to pattern n-type gate electrodes 14 and p-type gate electrodes 15.

Figure 2N:
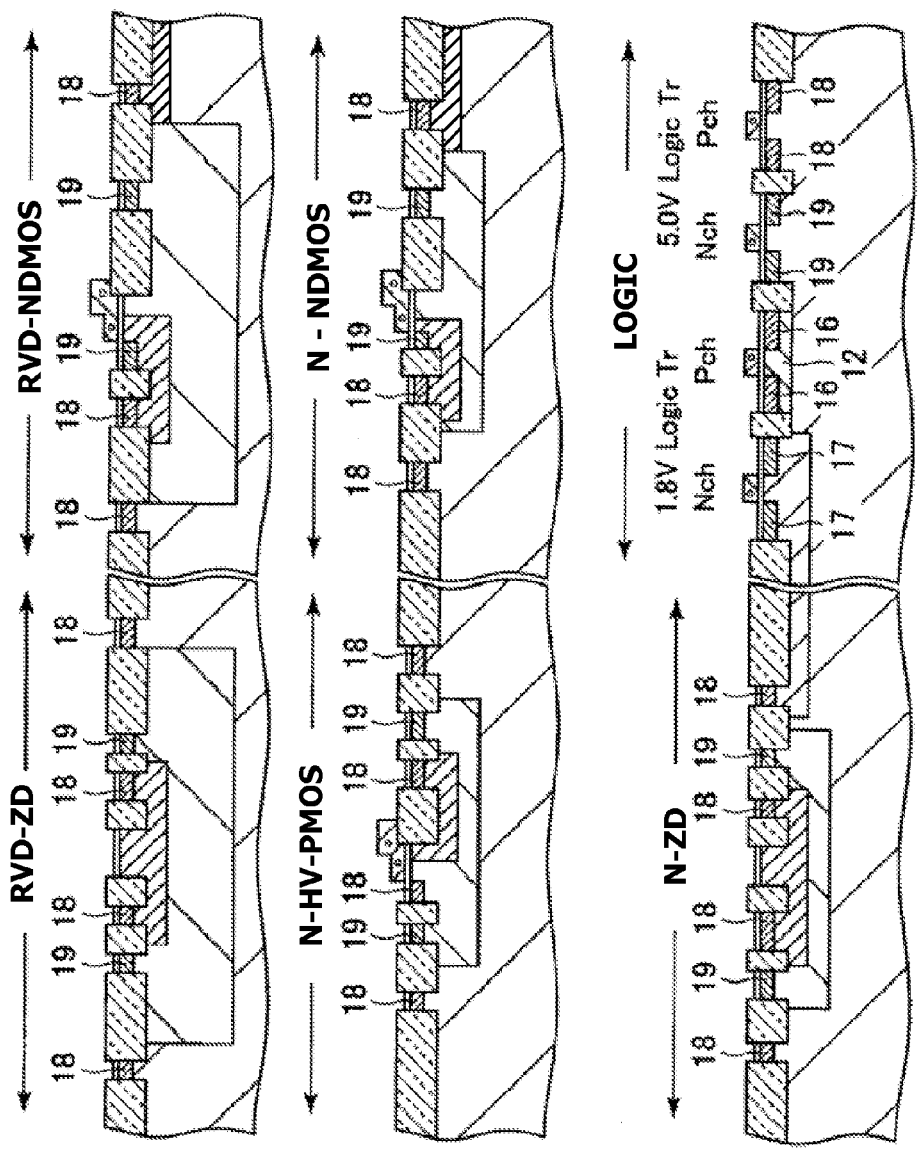
Figure 20:
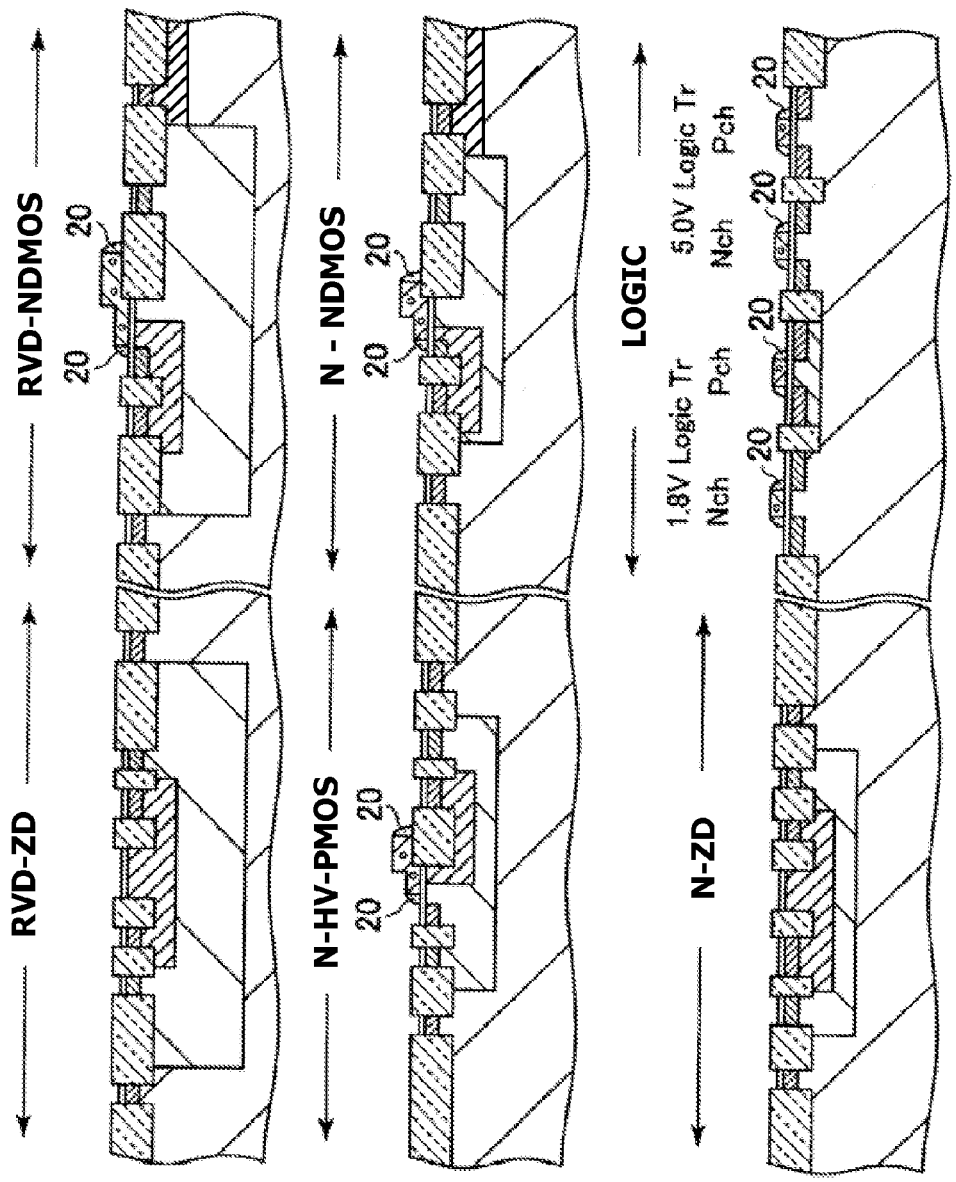

As depicted in FIG. 2N, ion implantations are carried out to form source/drain regions of 1.8V-drive CMOS transistors. Using a resist mask, $BF_2^+$ ion is implanted in a PMOS region at an acceleration energy of 5 keV and a doze of $3.0\times10^{14}$ cm$^{-2}$. Thus, p-type regions 16 are formed. Pocket regions may be formed by implantation of $P^+$ ion at an acceleration energy of 20 keV and a doze of $6.0\times10^{13}$ cm$^{-2}$. Using another resist mask, $As^+$ ion is implanted in a NMOS region at an acceleration energy of 15 keV and a doze of $5.0\times10^{14}$ cm$^{-2}$. Thus, n-type regions 17 are formed. Pocket region may be formed by implantation of $B^+$ ion at an acceleration energy of 20 keV and a doze of $1.0\times10^{13}$ cm$^{-2}$.

Subsequently, ion implantation is carried out to form p-type regions 18 which will form LDD regions of 5V-drive PMOS transistors, contact portions of p-type backgate wells of RVD- and normal NDMOS transistors, and source/drain regions of normal high voltage PMOS transistor, etc. For example, $BF_2^+$ ion is implanted at an acceleration energy of 80 keV and a doze of $4.5\times10^{13}$ cm$^{-2}$. Also, ion implantation is carried out to form n-type regions 19 which will form LDD regions of 5V-drive NMOS transistors, source/drain junction regions of RVD- and normal NDMOS transistors, well contact portions of reverse voltage durable regions, NDMOS transistors, and Zener diode regions. For example, $P^+$ ion is implanted at an acceleration energy of 35 keV and a doze of $4.0\times10^{13}$ cm$^{-2}$.

As depicted in FIG. 2O, a silicon oxide film having a thickness of 100 nm, for example, is grown by CVD over the entire surface of the substrate and anisotropic etching such as reactive ion etching (RIE) is carried out to form side wall spacers 20 on the gate electrode side walls.

As depicted in FIG. 2P, a resist mask RM11 that covers n-type regions is formed, and $B^+$ ion is implanted at an acceleration energy of 5 keV and a doze of $2.0\times10^{15}$ cm$^{-2}$, and $F^+$ ion is implanted at an acceleration energy of 8 keV and a doze of $4.0\times10^{14}$ cm$^{-2}$, to form high concentration p-type regions 21. Subsequently, the resist mask RM11 is removed.

As depicted in FIG. 2Q, a resist mask RM12 that covers p-type regions is formed, and $P^+$ ion is implanted at an acceleration energy of 15 keV and a doze of $2.0\times10^{15}$ cm$^{-2}$ to form high concentration n-type regions 22, which include cathode regions of the Zener diodes, and the source/drain regions of the n-channel transistors. Subsequently, the resist mask RM12 is removed.

Figure 2R:
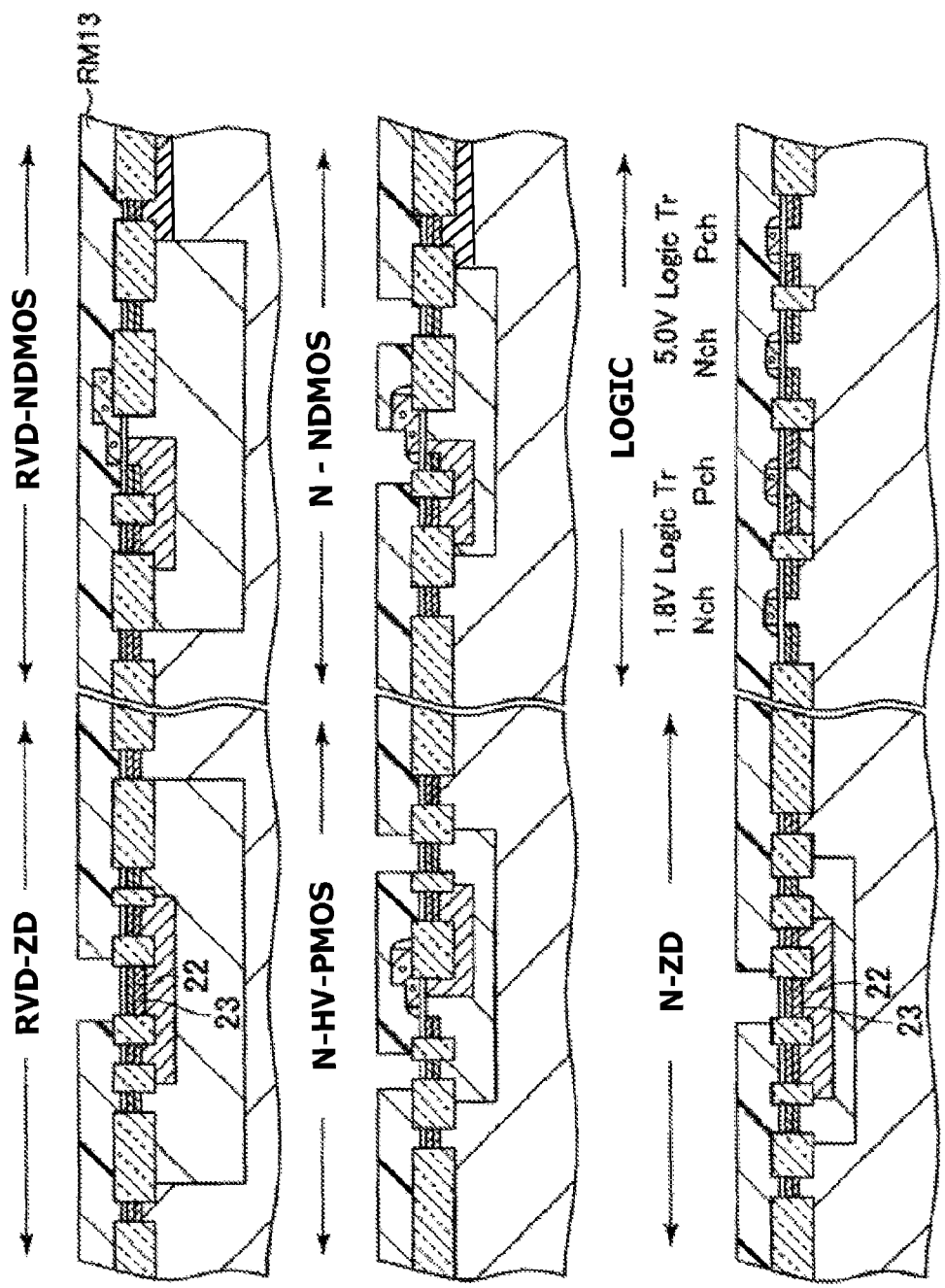

As depicted in FIG. 2R, a resist mask RM13 having openings on cathodes of Zener diodes is formed, and $B^+$ ion is implanted for Zener voltage adjustment at an acceleration energy of 65 keV and a doze of $2.0\times10^{13}$ cm$^{-2}$. Thus, p-type regions 23 are formed. Subsequently, the resist mask RM13 is removed. Annealing is carried out at $1{,}000°$ C. for 10 seconds in nitrogen atmosphere to activate the implanted impurities.

Figure 2S:
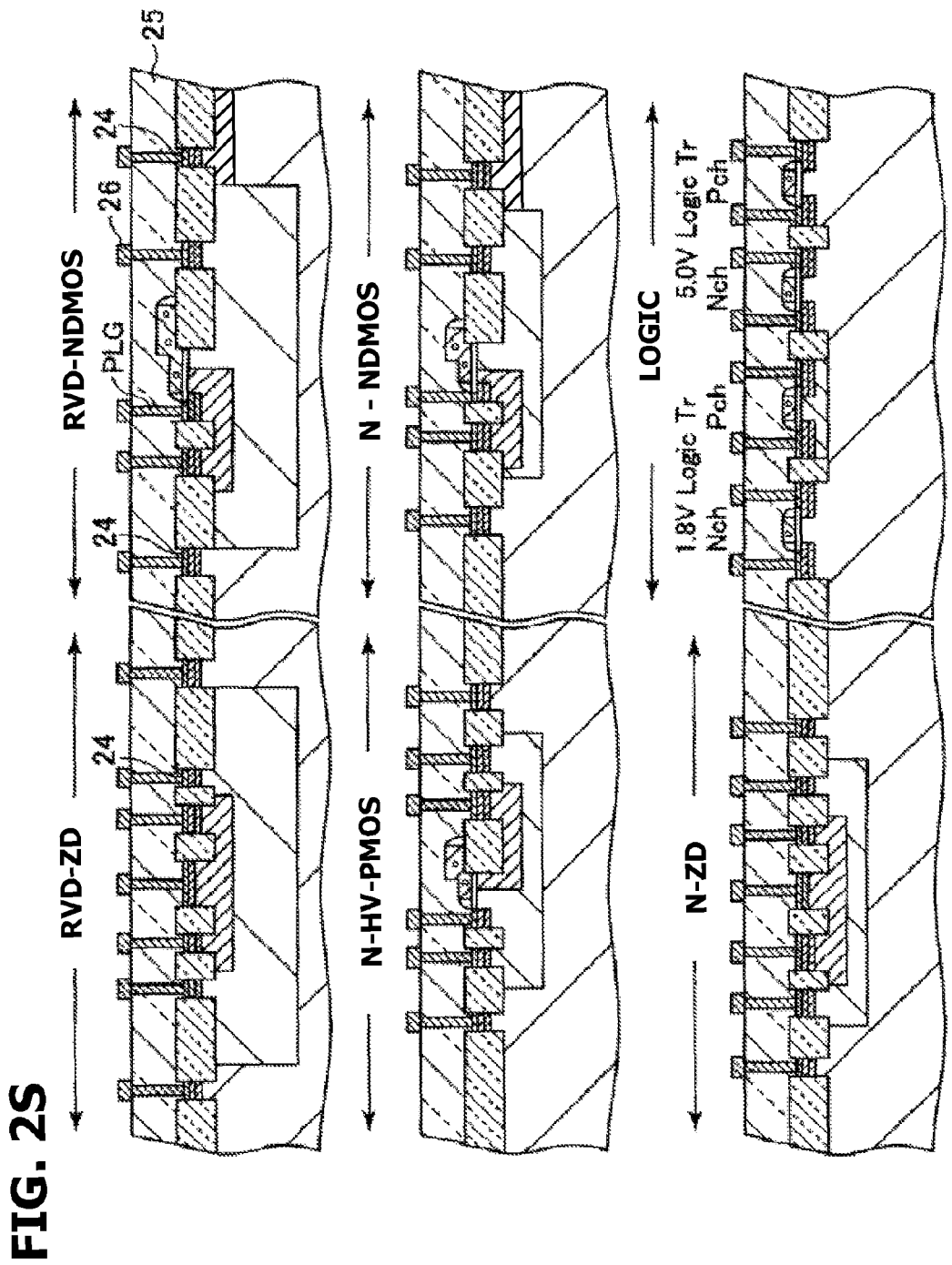

As depicted in FIG. 2S, using a cobalt film having a thickness of 6 nm, primary formation of cobalt silicide is carried out by silicidation reaction at $540°$ C. for 30 seconds in nitrogen atmosphere, unreacted portions are washed out, and secondary reaction of cobalt silicide is carried out at $750°$ C. for 30 seconds in nitrogen atmosphere. Thus, a silicide layer 24 is formed. An interlayer insulation film 25 is formed, and electrically conductive plugs PLG are embedded, and wirings 26 are formed. In this way, a semiconductor device that includes various semiconductor elements can be formed.

Regions formed by a same ion implantation basically have equivalent depths and equivalent impurity distributions. Regions formed by a same ion implantation and diffused by a same heat treatment basically have equivalent depths and equivalent impurity distributions.

Figure 3B:
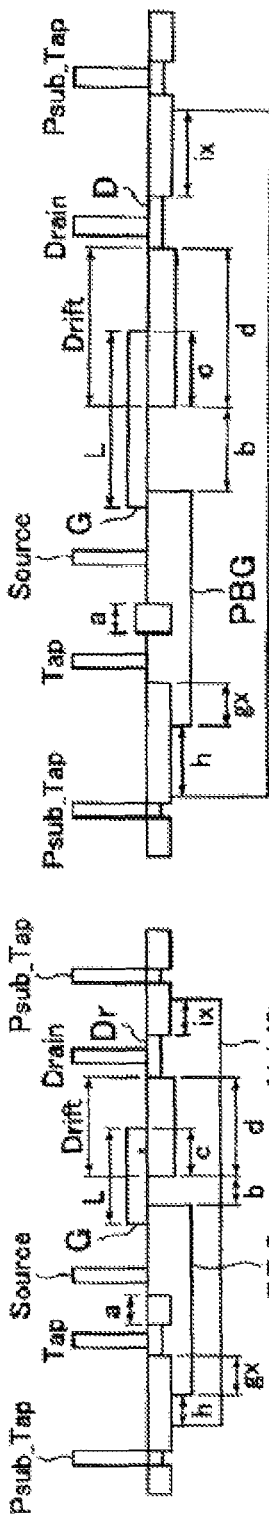
Figure 3D:
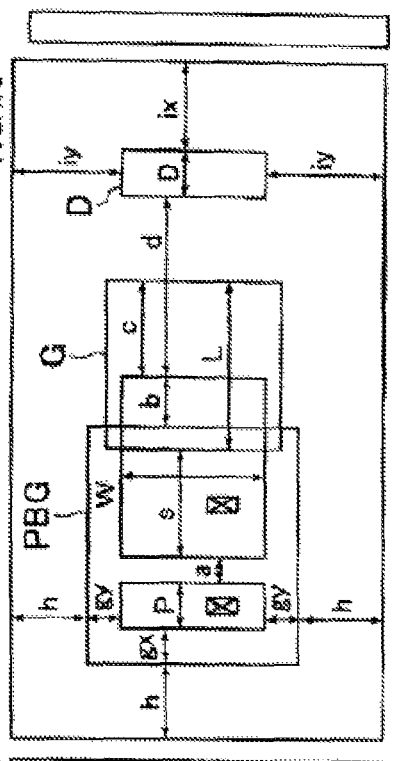
Figure 3E:
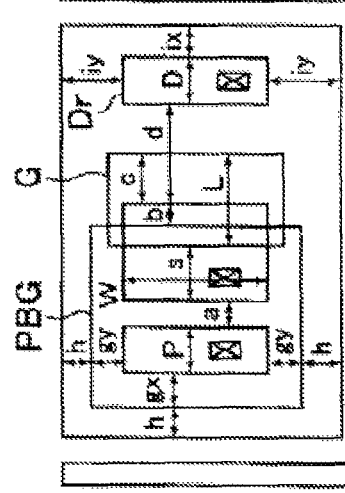
FIG. 3E is a table listing comparative values of their features.

FIGS. 3A and 3B are a cross section and a partial broken-out plan view of a lateral normal high breakdown voltage NDMOS transistor, FIGS. 3C and 3D are a cross section and a partial broken-out plan view of a lateral, reverse voltage durable, high breakdown voltage NDMOS transistor, and FIG. 3E is a table comparatively listing various features. In a reverse voltage durable NDMOS transistor, after ion implantation of the n-type drift region Ndrift, then-type region is expanded by thermal diffusion, and subsequently the depth and the area of the Ndrift region to obtain sufficiently high reverse voltage durability. In a normal NDMOS transistor, positive thermal diffusion of impurity is not performed, hence the depth and the area of the n-type drift region Ndrift are restricted by the resist mask size and the acceleration energy of ion implantation, allowing the n-type drift region to be accommodated in a small space.

FIGS. 4A and 4B are a cross section of a normal Zener diode for protection of normal NDMOS transistors and a partial broken-out section thereof, and FIGS. 4C and 4D are a cross section of a reverse voltage durable Zener diode for protection of reverse voltage durable NDMOS transistors and a partial broken-out section thereof, with FIG. 4E giving a table that compares dimensions a, b, and c. The Zener diode regions have the same size. In the reverse voltage durable Zener diode for protection of reverse voltage durable NDMOS transistors, an ion is implanted in an n-type well NW surrounding the anode region of a Zener diode, and subsequently the n-type region is enlarged by thermal diffusion, resulting in an about three-fold increase in size c due to an increase in the depth and area of the n-type well NW. This ensures an adequately high reverse voltage durability against the p-type substrate. For a normal Zener diode for protection of normal NMOS transistors, in which thermal impurity diffusion is not performed positively, the depth and area of the n-type well NW is restricted by the resist mask size and the acceleration energy used for ion implantation, allowing it to be accommodated in a small area.

A semiconductor element manufactured according to the this embodiment will have following characteristics.
Normal NDMOS Transistor
Threshold voltage Vth: 1.01 V (voltage Vg at Vd=15 V, Psub=PBG=S=0 V, Id=2 µA)
On-state current Ion: 5.79 mA (drain current at Vd=40 V, Psub=PBG=S=0 V, Vg=5 V)
BVsd: 42 V or more (voltage Vd at Vg=0 V, Psub=PBG=S=0 V, Id=0.1 µA)
Reverse voltage durability: −10 V (voltage of p-type backgate well at Vd=0 V, Psub=0 V, G=S=floating, p-type backgate well current=−0.1 µA)
Reverse Voltage Durable NDMOS Transistor
Threshold voltage Vth: 1.0 V (voltage Vg at Vd=15 V, Psub=PBG=S=0 V, Id=2 µA)
On-state current Ion: 5.73 mA (drain current at Vd=40 V, Psub=PBG=S=0 V, Vg=5 V)
BVsd: 42 V or more (voltage Vd at Vg=0 V, Psub=PBG=S=0 V, Id=0.1 µA)
Reverse voltage durability: −35 V (voltage of p-type backgate well at Vd=0 V, Psub=0 V, G=S=floating, p-type backgate well current=−0.1 µA)
Zener Diode for Protection of Normal NDMOS Transistors
Zener voltage: 6.5 V
Reverse voltage durability: −10 V (anode voltage at n-well=0 V, Psub=0 V, cathode=floating, anode=0.1 µA)
Zener Diode for Protection of Reverse Voltage Durable NDMOS Transistors
Zener voltage: 6.5V
Reverse voltage durability: −35 V (anode voltage at n-well=0 V, Psub=0 V, cathode=floating, anode=0.1 µA)

CAN performs communication among a plurality of on-vehicle modules using a common bus line. Being of an on-vehicle type, normally applied voltage range is battery power source voltage (12 V to 24 V). It is required not to change the bus potential of CAN signal lines even when an LSI is disconnected from GND due to some traveling trouble.

Figure 5A:
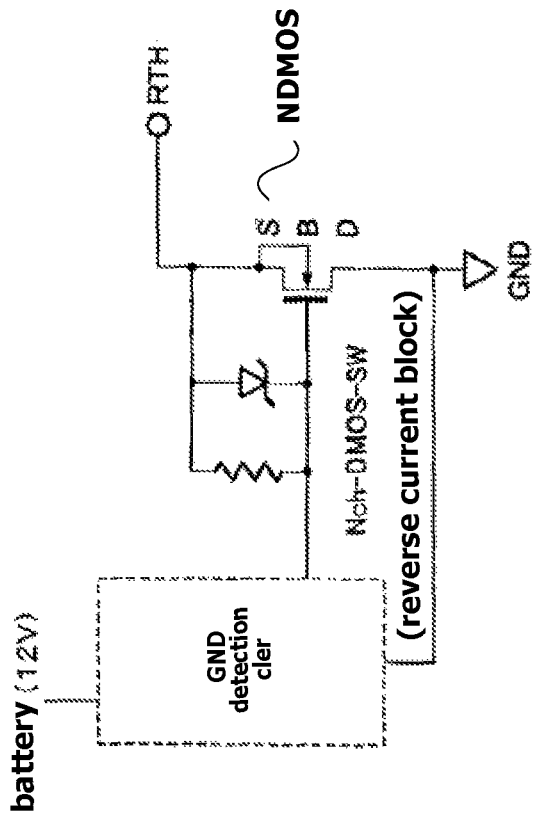
FIG. 5A is an equivalent circuit diagram illustrating an application to a CAN system.
Figure 5B:
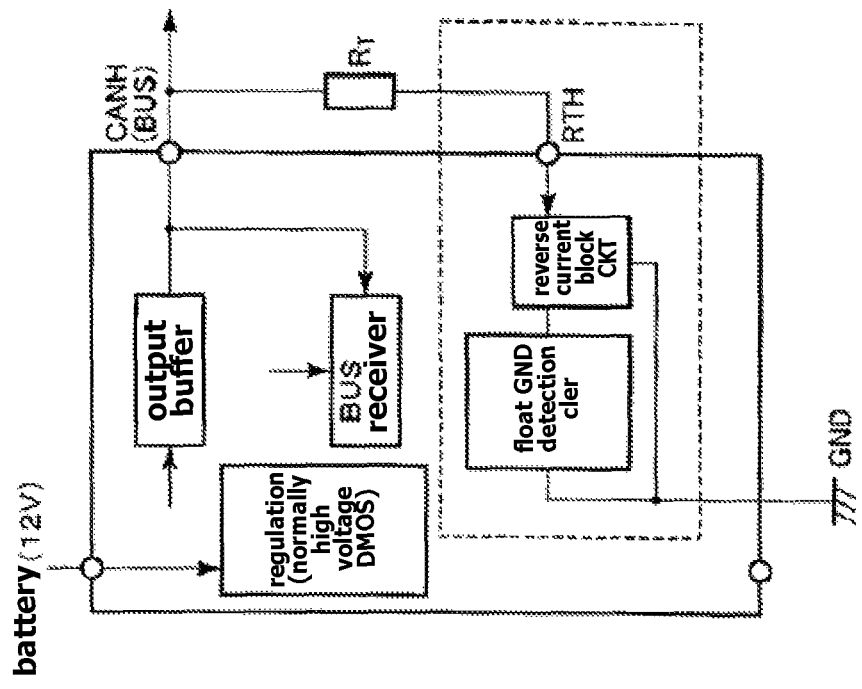
FIG. 5B is an enlargement of a portion defined by a broken line in FIG. 5A.

FIG. 5A is an equivalent circuit diagram of a unit circuit applied to CAN system, and FIG. 5B is an enlarged view of a portion defined by a broken line in FIG. 5A. For the RTH terminal, a ground fault protection circuit as indicated by a broken line is provided to monitor the ground potential. The RTH terminal normally gives 0.1 V as the standard potential for the lower part of the bus of CAN. As illustrated in FIG. 5B, an on-state voltage is normally supplied to the reverse current blocking circuit so that the NDMOS is in an on-state to maintain the RTH terminal at a potential equivalent to the ground.

If the ground fault detection circuit detects a ground fault, the output to the reverse current blocking circuit is shut off. The semiconductor substrate voltage has increased, and the NDMOS gate voltage is now equal to the bus voltage to turn off the NDMOS. The GND potential which is in a floating state is cut off at the drain of the NDMOS. The NDMOS gate voltage becomes equal to the bus-side RTH potential, and the NDMOS channel voltage and source voltage also become equal the bus-side RTH potential. Thus the bus is protected. To cut off the GND potential of a floating state, it is necessary for the NDMOS to be reverse voltage durable. Abnormal voltage of GND connected to the drain of the reverse current blocking NDMOS is cut off by NDMOS, making it possible to prevent an abnormal voltage from being applied to the RTH terminal.

It is necessary for the reverse current blocking NDMOS to be electrically separated from the substrate even when GND is disconnected. If not reverse voltage durable, it allows the power source voltage to be supplied to the RTH terminal even if it is disconnected in the circuit. The use of a reverse voltage durable NDMOS and a reverse voltage durable Zener diode as described in the above embodiments serves to avoid this problem. A reverse voltage durable NDMOS serves to connect the p-type backgate and the source to the bus side of CAN via resistance and connect the drain terminal to its GND terminal side.

With this connection, the drain-side terminal of the high breakdown voltage DMOS blocks a reverse current caused by a ground fault in the LSI, and accordingly, the electric field is relaxed by the n-type drift region to prevent the battery voltage from being applied to the gate oxide film of the reverse voltage durable NDMOS, thereby preventing gate destruction. The voltage applied from the p-type substrate is shut off by a p-type backgate and an n-type drift region of a reverse voltage durable structure, making it possible to prevent the battery voltage from leaking into the bus of the CAN.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What are claimed are:

1. A semiconductor device comprising:
a p-type semiconductor substrate;
a first n-type well formed in the p-type semiconductor substrate with a first depth from a surface of the p-type semiconductor substrate;
a second n-type well formed in the p-type semiconductor substrate with a second depth from the surface of the p-type semiconductor substrate, the second depth being smaller than the first depth;
a first and a second p-type backgate regions formed in the first and the second n-type wells, respectively;
a first and a second n-type source regions formed in the first and the second p-type backgate regions, respectively;
a first and a second n-type drain regions formed in the first and the second n-type wells, respectively, at positions opposing to the first and the second n-type source regions, with the first and the second p-type backgate regions located in between; and
field insulation films formed on the p-type semiconductor substrate, at positions between the first and the second p-type backgate regions and the first and the second n-type drain regions, respectively;
wherein a first transistor with a low reverse voltage durability is formed in the first n-type well and a second transistor with a reverse voltage durability higher than that of the first transistor is formed in the second n-type well.

2. A semiconductor device as defined in claim 1, wherein the first transistor has a smaller in-plane area than that of the second transistor.

3. A semiconductor device as defined in claim 1, further comprising a first Zener diode which includes:
a third n-type well formed with substantially same depth from the surface of the p-type semiconductor substrate and substantially same impurity concentration distribution as those of the second n-type well;
a first p-type anode region formed in the third n-type well with substantially same depth and impurity concentration distribution as those of the second p-type backgate region; and
a first n-type cathode region formed in the first p-type anode region with substantially same depth and impurity concentration distribution as those of the second source region.

4. A semiconductor device as defined in claim 3, further comprising a second Zener diode which includes:
a fourth n-type well formed with substantially same depth from the surface of the p-type semiconductor substrate and substantially same impurity concentration distribution as those of the first n-type well;
a second p-type anode region formed in the fourth n-type well with substantially the same depth and impurity concentration distribution as those of the first p-type backgate region; and
a second n-type cathode region formed in the second p-type anode region with substantially same depth and impurity concentration distribution as those of the first source region.

5. A CAN system including a plurality of communications modules, and a reverse current blocking circuit, the reverse current blocking circuit comprising:
a p-type semiconductor substrate;
a first n-type well formed in the p-type semiconductor substrate with a first depth from a surface of the p-type semiconductor substrate;
a second n-type well formed in the p-type semiconductor substrate with a second depth from the surface of the p-type semiconductor substrate, the second depth being smaller than the first depth;
a first and a second p-type backgate regions formed in the first and the second n-type wells, respectively;
a first and a second n-type source regions formed in the first and the second p-type backgate regions, respectively;
a first and a second n-type drain region formed in the first and the second n-type wells, respectively, at positions opposing to the first and the second n-type source regions, with the first and the second p-type backgate regions located in between; and
field insulation films formed on the p-type semiconductor substrate, at positions between the first and the second p-type backgate regions and the first and the second n-type drain regions, respectively;
wherein a first transistor with a reverse voltage durability is formed in the first n-type well and a second transistor with a reverse voltage durability lower than that of the first transistor is formed in the second n-type well.

* * * * *